(12) United States Patent
Sun et al.

(10) Patent No.: US 9,343,171 B1
(45) Date of Patent: May 17, 2016

(54) REDUCED ERASE-VERIFY VOLTAGE FOR FIRST-PROGRAMMED WORD LINE IN A MEMORY DEVICE

(71) Applicant: SanDisk Technologies Inc., Plano, TX (US)

(72) Inventors: Yongke Sun, Pleasanton, CA (US); Yingda Dong, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/617,182

(22) Filed: Feb. 9, 2015

(51) Int. Cl.
| | | |
|---|---|---|
| *G11C 11/34* | (2006.01) | |
| *G11C 16/34* | (2006.01) | |
| *G11C 16/04* | (2006.01) | |
| *G11C 16/14* | (2006.01) | |
| *G11C 16/26* | (2006.01) | |

(52) U.S. Cl.
CPC ........ *G11C 16/3445* (2013.01); *G11C 16/0483* (2013.01); *G11C 16/14* (2013.01); *G11C 16/26* (2013.01); *G11C 16/349* (2013.01)

(58) Field of Classification Search
CPC .... G11C 16/16; G11C 11/5635; G11C 16/14; G11C 16/3459; G11C 16/3445; G11C 16/0483; G11C 16/10; G11C 16/3436; G11C 11/5642; G11C 16/344; G11C 16/04; G11C 16/0408; G11C 16/107
USPC ............ 365/185.11, 185.22, 185.17, 185.19, 365/185.29, 185.05, 185.14, 185.21, 365/185.24, 185.33, 185.09, 185.18, 185.2, 365/185.23
See application file for complete search history.

(56) References Cited

U.S. PATENT DOCUMENTS

| | | | |
|---|---|---|---|
| 7,468,926 B2 | 12/2008 | Shappir et al. | |
| 8,036,044 B2 | 10/2011 | Dong et al. | |
| 8,130,551 B2 | 3/2012 | Oowada et al. | |
| 8,787,088 B2 | 7/2014 | Dutta et al. | |
| 8,804,425 B2 | 8/2014 | Chen et al. | |
| 8,885,420 B2 | 11/2014 | Oowada et al. | |
| 2007/0047327 A1 | 3/2007 | Goda et al. | |
| 2011/0128791 A1 | 6/2011 | Chang et al. | |
| 2014/0003156 A1 | 1/2014 | He | |
| 2014/0119121 A1 | 5/2014 | Aritome | |
| 2014/0247666 A1 | 9/2014 | Dutta et al. | |
| 2014/0247668 A1 | 9/2014 | Costa et al. | |
| 2015/0003162 A1* | 1/2015 | Mui et al. ........... | G11C 11/5635 365/185.17 |

* cited by examiner

*Primary Examiner* — Thong Q Le

(74) *Attorney, Agent, or Firm* — Vierra Magen Marcus LLP

(57) ABSTRACT

An erase operation for a memory cells in a block provides a consistent and sufficient erase depth regardless of the number of programmed word lines in the block. A lower erase-verify voltage is used for a first-programmed word line of a set of word lines than for remaining word lines in the set. As a result, the resistance of a memory cell of the first-programmed word line dominates during sensing of the NAND string so that the number of erase loops can be controlled in a predictable way regardless of the number of programmed word lines. The lower erase-verify voltage can be optimized so that it does not change the number of erase loops to complete an erase operation, compared to the case where a common erase-verify voltage is used on all word lines.

21 Claims, 18 Drawing Sheets

Fig. 2

Code in storage device (150)

boot code (151)

control code / set of instructions (160)

instructions for perform a plurality of erase-verify loops for a set of memory cells, wherein each erase-verify loop comprises an erase portion in which a positive channel-to-gate voltage is provided for each memory cell followed a verify test in which a first verify voltage is applied to a first-programmed word line of a plurality of word lines and, concurrently, a second verify voltage, higher than the first verify voltage is applied to remaining word lines of the plurality of word lines(161)

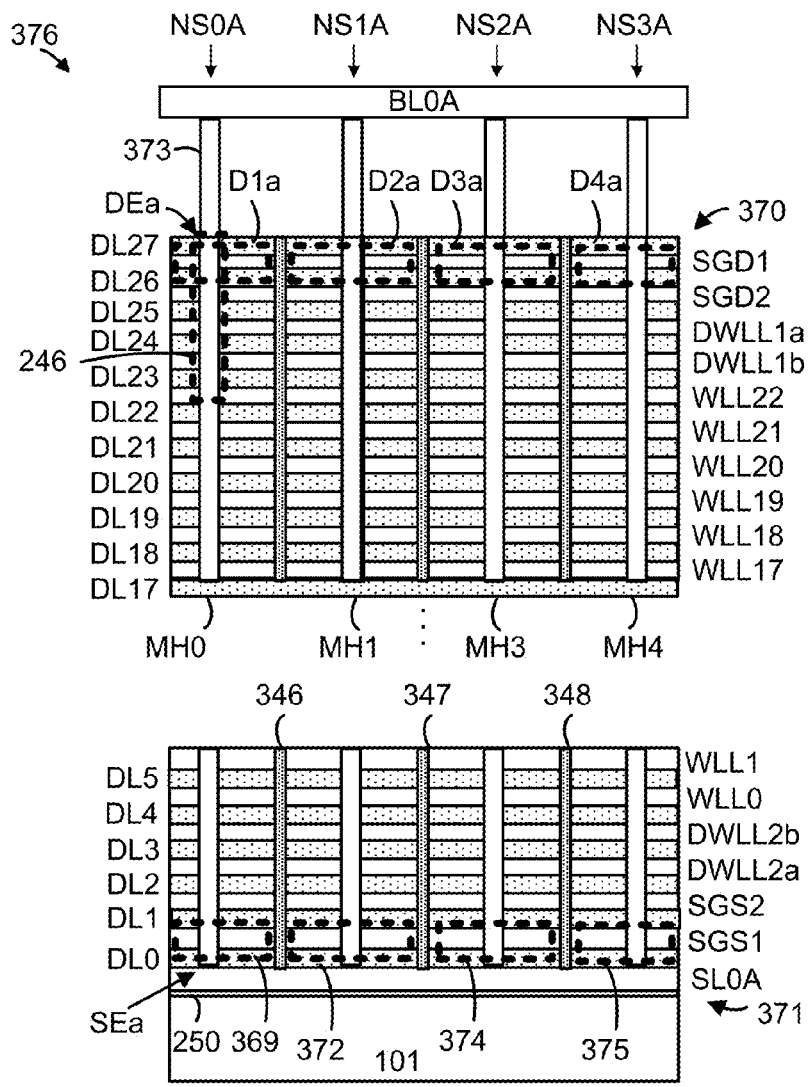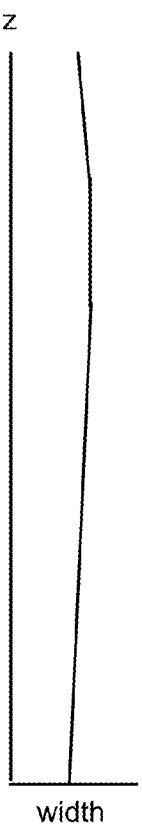
Fig. 3C1
Fig. 3C2

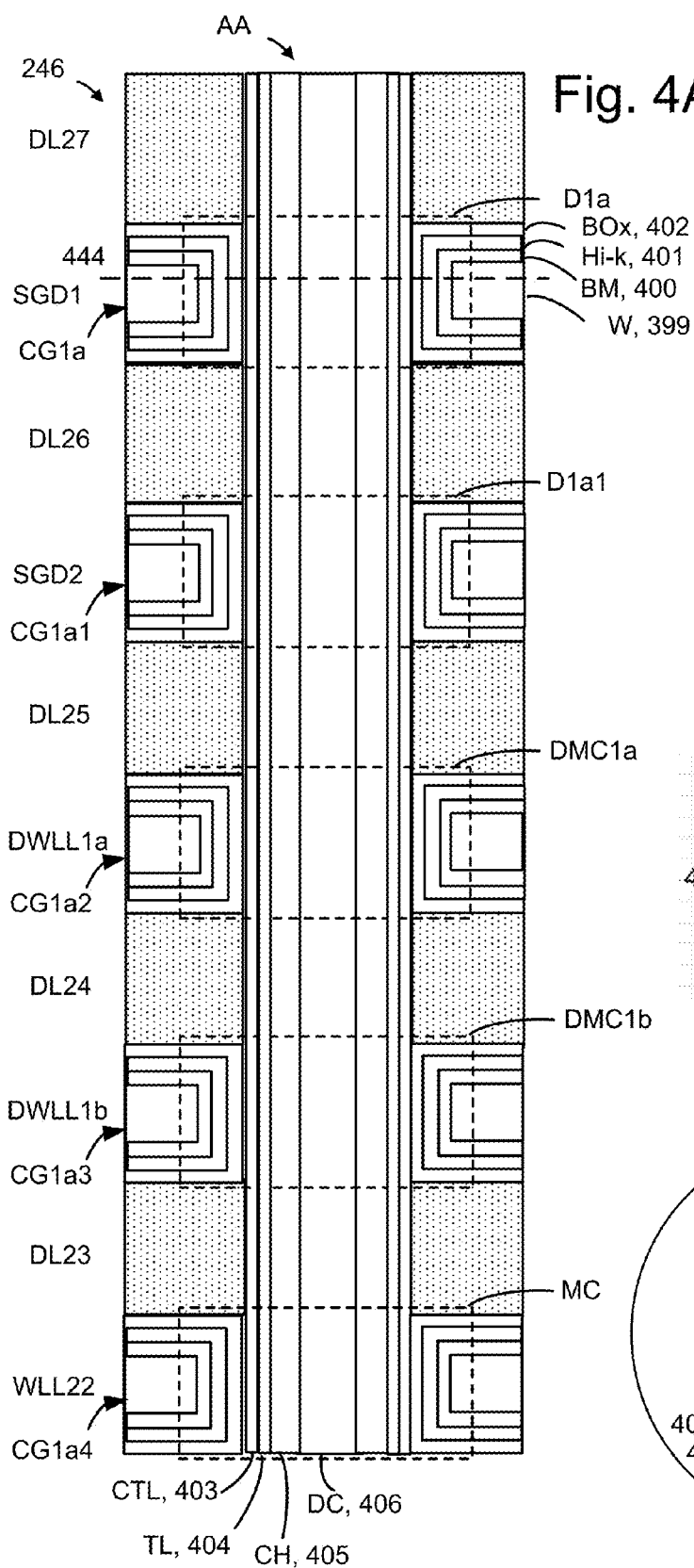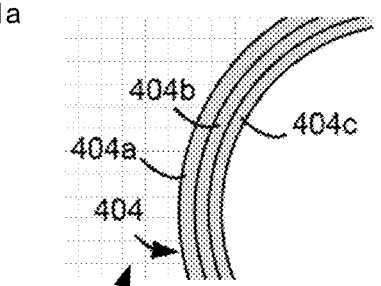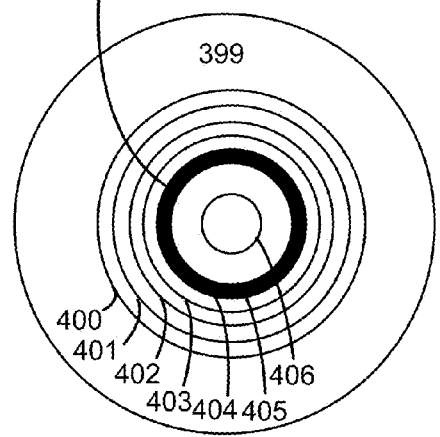

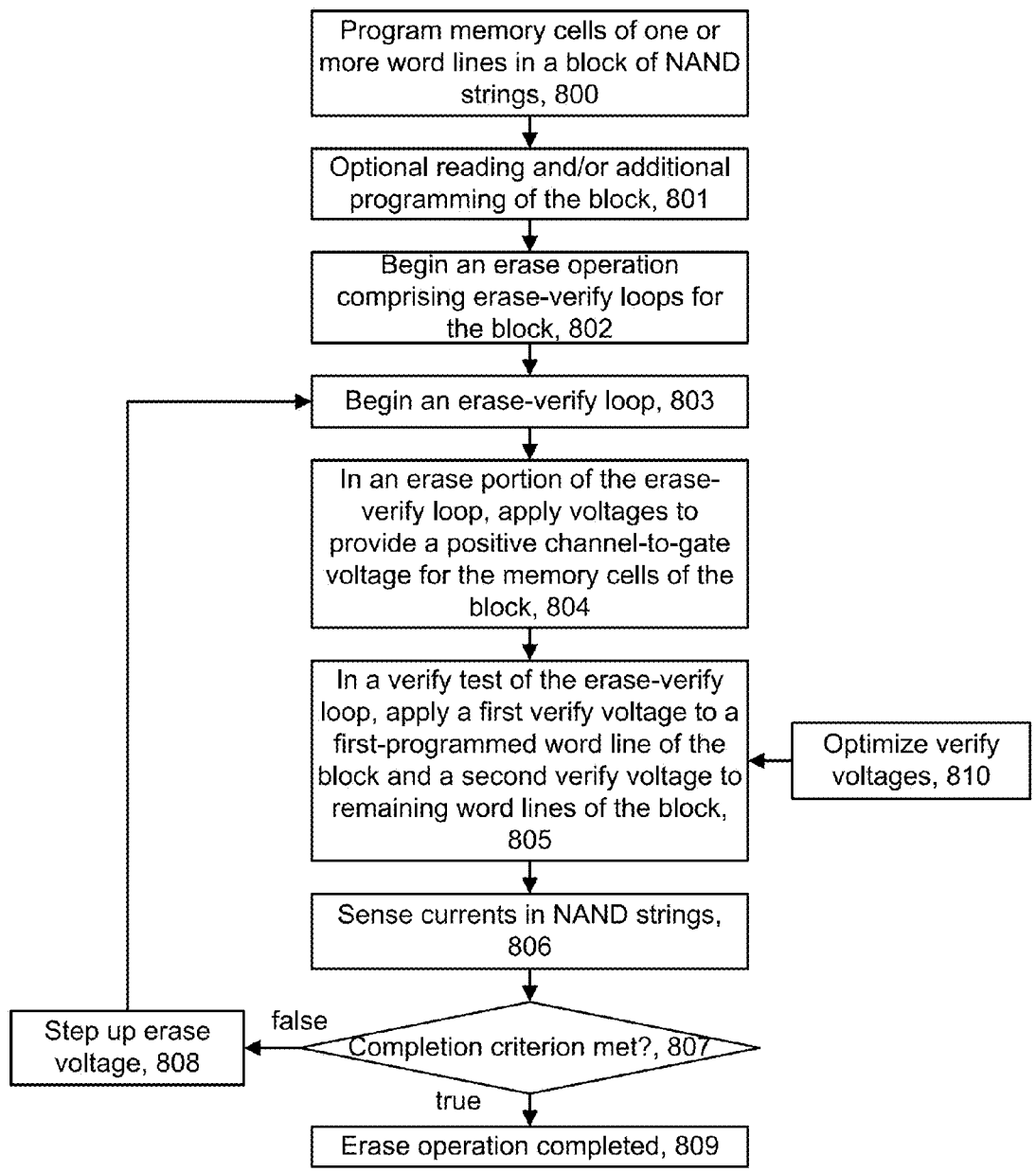

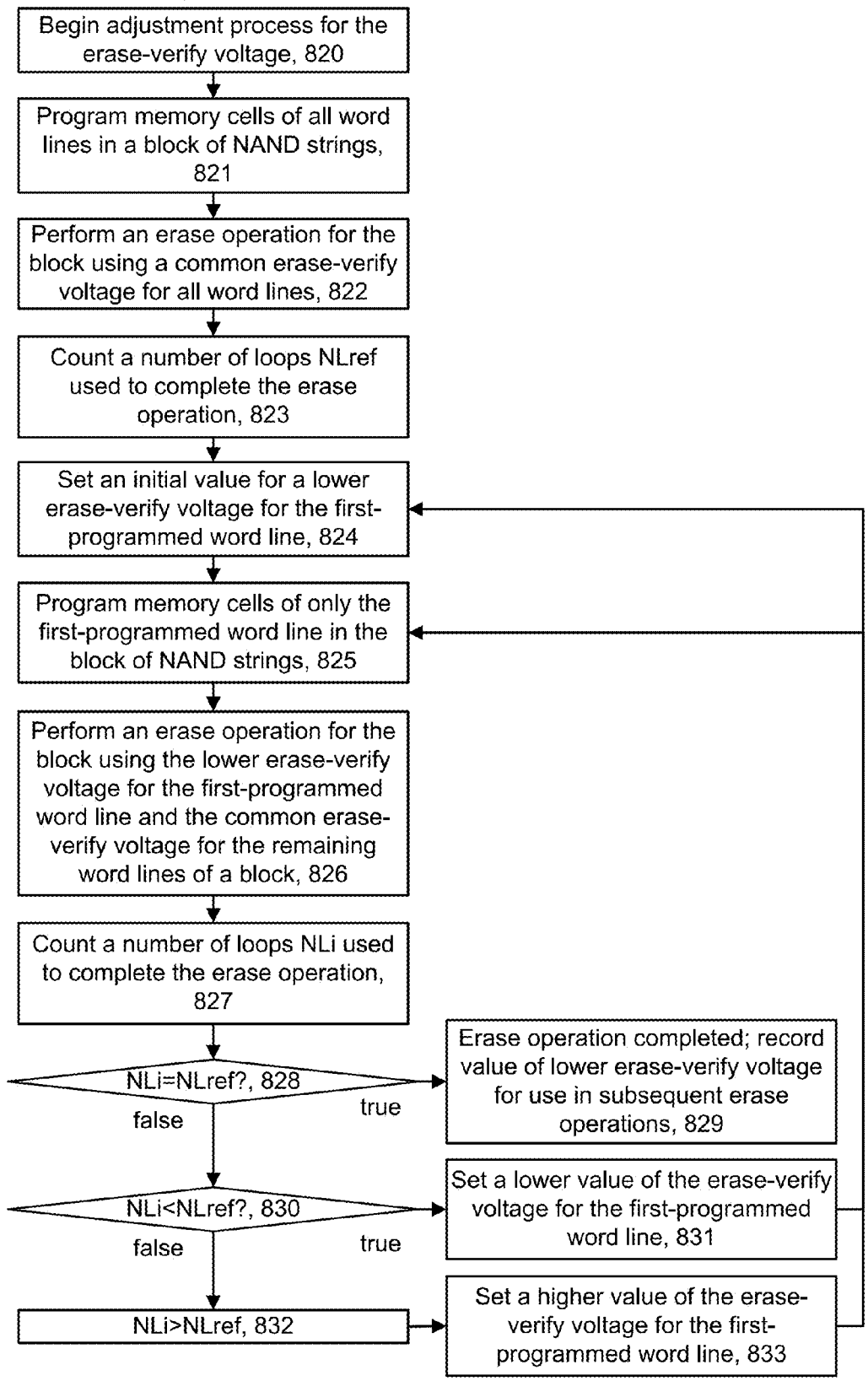

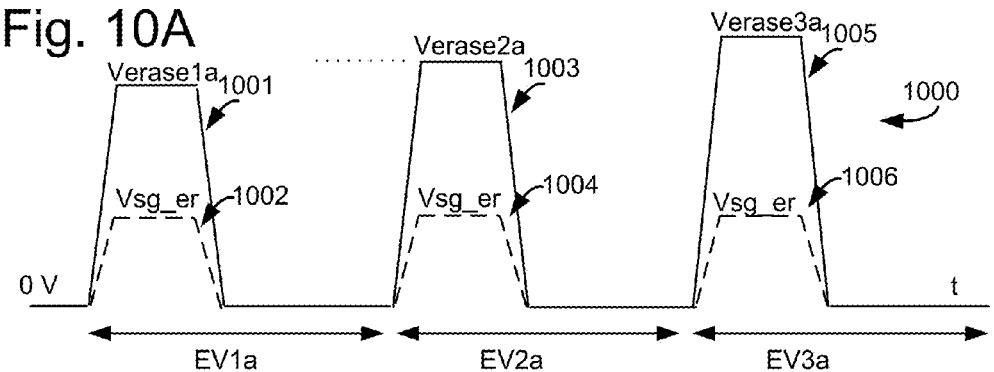
Fig. 10A
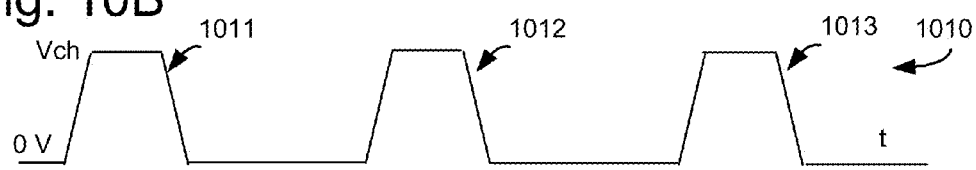
Fig. 10B
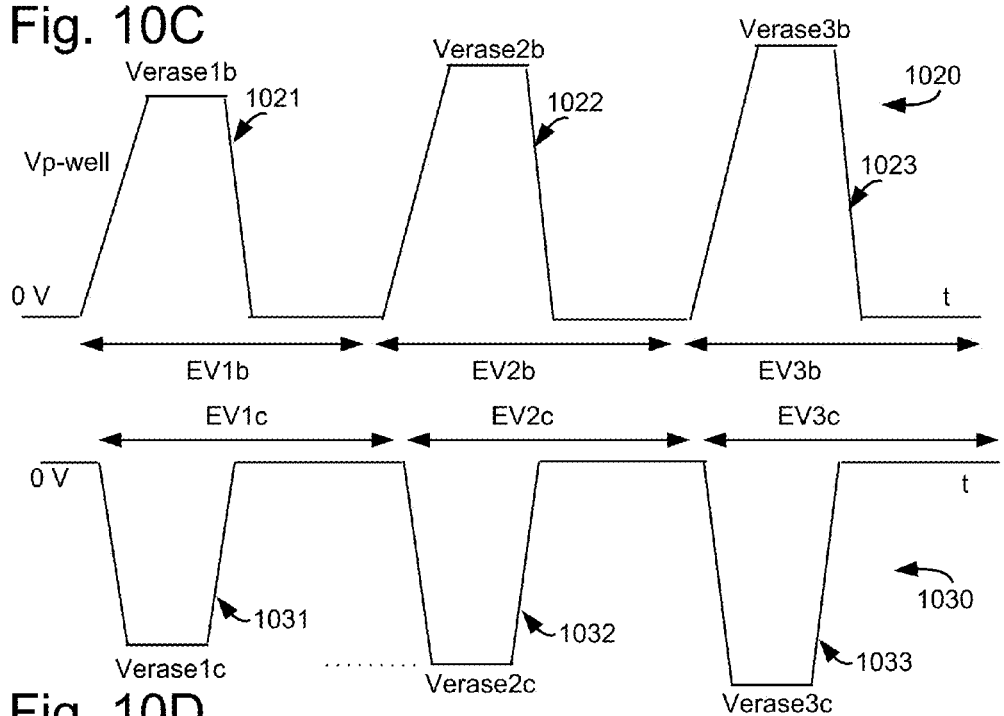
Fig. 10C
Fig. 10D
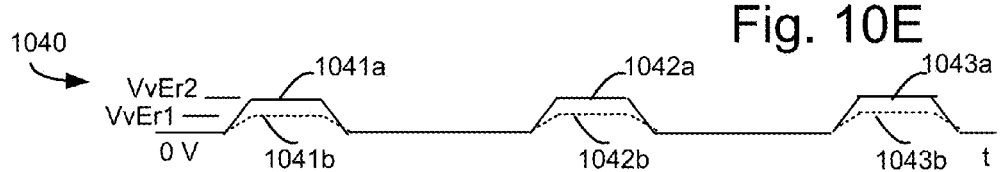
Fig. 10E

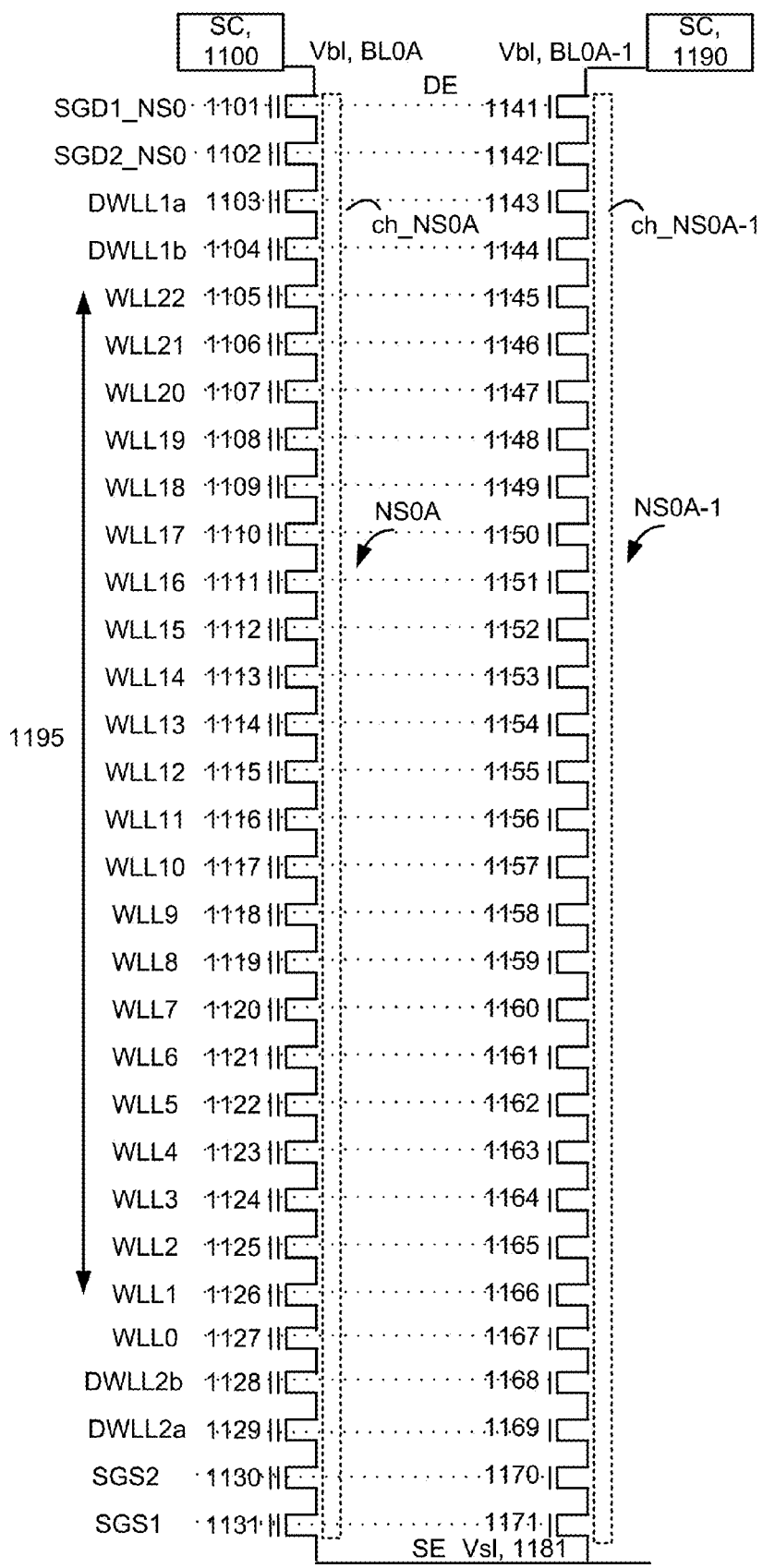

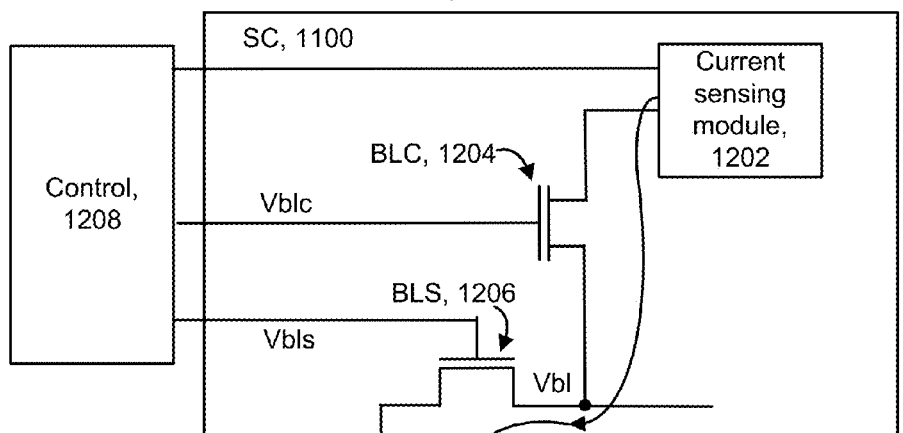
Fig. 12A
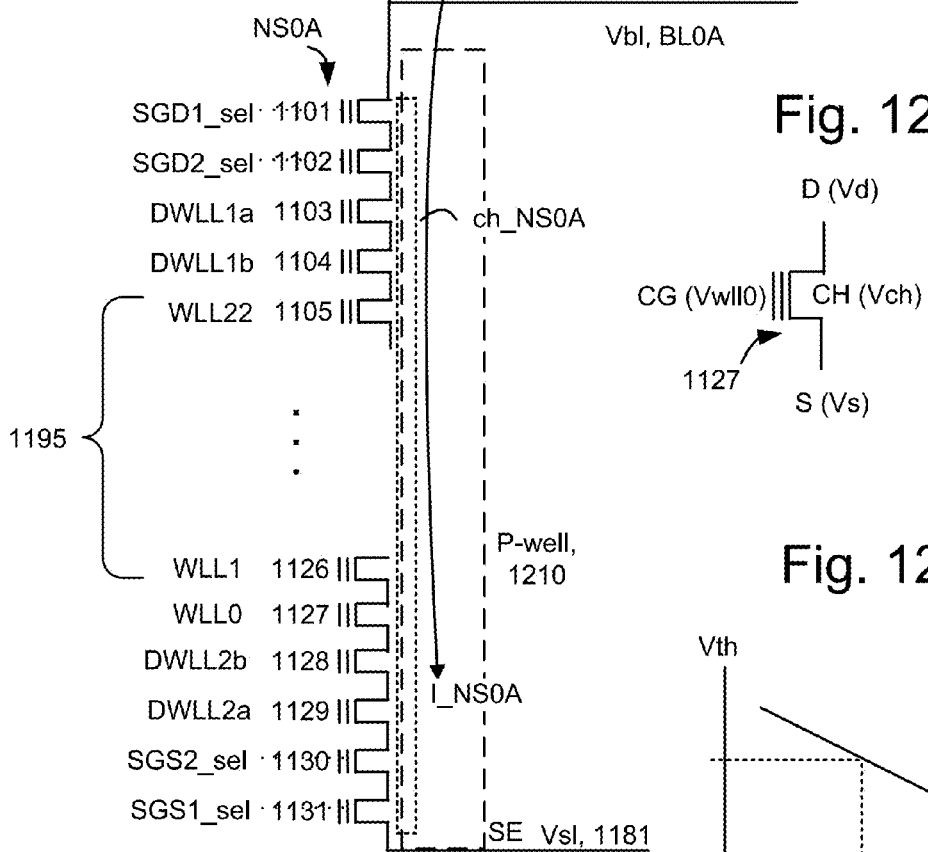
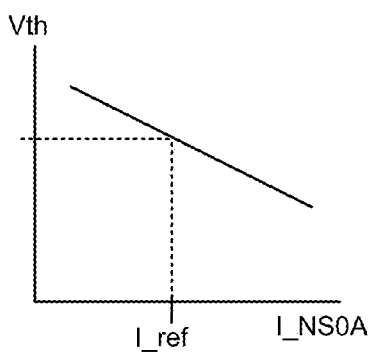
Fig. 12B
Fig. 12C

US 9,343,171 B1

REDUCED ERASE-VERIFY VOLTAGE FOR FIRST-PROGRAMMED WORD LINE IN A MEMORY DEVICE

BACKGROUND

The present technology relates to operation of memory devices.

Semiconductor memory devices have become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories.

In one approach, a memory device comprises memory cells arranged in NAND strings. Each memory cell comprises a charge-storage material such as a floating gate or a charge-trapping material which can store an amount of charge which represents a data state. The amount of charge is increased during programming or decreased during erase. Moreover, the charge-storage material can be arranged vertically in a three-dimensional (3D) stacked memory structure, or horizontally in a two-dimensional (2D) memory structure.

One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

However, various challenges are presented in operating such memory devices.

BRIEF DESCRIPTION OF THE DRAWINGS

Like-numbered elements refer to common components in the different figures.

FIG. 2 depicts example code which may be executed by a processor.

FIG. 3C1 depicts an embodiment of a stack 376 showing a cross-sectional view of the portion 307 of FIG. 3A, along line 305, where two SGD layers, two SGS layers and dummy word line layers DWLL1a, DWLL1b, DWLL2a and DWLL2b are provided.

FIG. 3C2 depicts a variation in the width of a memory hole along its height.

FIG. 4A depicts a view of the region 246 of FIG. 3C1, showing SGD transistors D1a (consistent with FIG. 3C1) and D1a1 above dummy memory cells DMC1a and DMC1b and a data memory cell MC.

FIG. 4B1 depicts a cross-section view of the region 246 of FIG. 4A along line 444.

FIG. 4B2 depicts a close-up view of the tunneling layer 404 of FIG. 4B1, showing an oxide 404a, nitride 404b, oxide 404c configuration.

FIG. 8A depicts an example process for programming and erasing memory cells in a block.

FIG. 8B depicts an example optimization process for setting a verify voltage, consistent with step 810 of FIG. 8A.

FIG. 10A depicts example voltages in an erase operation consistent with step 804 of FIG. 8A and steps 822 and 826 of FIG. 8B, wherein the erase operation uses gate-induced drain leakage (GIDL) to charge up the channel of a NAND string.

FIG. 10B depicts an example channel voltage consistent with FIG. 10A.

FIG. 10C depicts example erase voltages in an erase operation consistent with step 804 of FIG. 8A and steps 822 and 826 of FIG. 8B, wherein the erase operation applies a positive voltage to a p-well of a substrate.

FIG. 10D depicts example erase voltages in an erase operation consistent with step 804 of FIG. 8A and steps 822 and 826 of FIG. 8B, wherein the erase operation applies a negative voltage to the word lines in a block.

FIG. 10E depicts example verify voltages in an erase operation consistent with step 807 of FIG. 8A and steps 822 and 826 of FIG. 8B.

FIG. 11 depicts a circuit diagram of example NAND strings NS0A and NS0A-1 consistent with the memory devices of FIG. 3A to 3D.

FIG. 12A depicts a configuration of the NAND string NS0A and the sensing circuitry 1100 of FIG. 11 with components for erase-verify sensing.

FIG. 12B depicts the example memory cell 1127 of FIG. 12A.

FIG. 12C depicts a plot of Vth versus I_NS0A, a current in NS0A during an erase-verify test, consistent with step 807 of FIG. 8A and steps 822 and 826 of FIG. 8B.

DETAILED DESCRIPTION

Figure 1A:
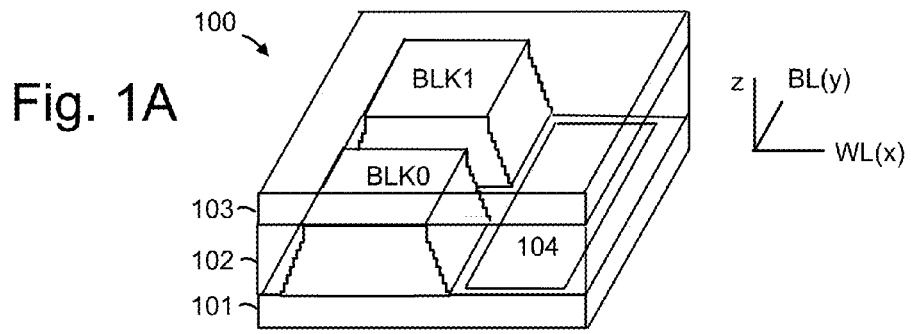
FIG. 1A is a perspective view of a 3D stacked non-volatile memory device.

Techniques are provided for erasing memory cells in a memory device.

An erase operation involves a set of memory cells, typically in a block in which memory cells are arranged along a plurality of word lines. During the erase operation, it is desired to lower the threshold voltage (Vth) of each memory cell below an erase-verify level which represents an erased data state. Subsequently, during a programming operation, some of the memory cells are programmed to a higher Vth while others remain in the erased state. However, if the Vth is not lowered sufficiently during the erase operation, the Vth of the erased state memory cells can begin to overlap with the lowest programmed data state, e.g., the A state. The Vth of the erased state memory cells can increase over time due to program disturb and these memory cells will have a higher error rate. In a worst case, uncorrectable errors can occur.

A problem arises in that an erase-verify test measures a current in a NAND string which is a function of the Vth of each memory cell in the NAND string. Thus, a NAND string may pass an erase-verify test even if the Vth of some of the memory cells is above the erase-verify level. This can occur when some of the word lines are programmed and some are erased at the start of the erase operation. For example, in some cases, fewer than all word lines in a block are programmed with data. The erase operation will complete prematurely and the erased word lines will have a shallow erase depth.

One approach is to apply a minimum number of erase pulses during an erase operation so that the memory cells are erased to at least a specified depth. However, this approach has potential reliability problems because with PE cycling, the erase operation becomes harder to complete and more loops are needed to completely erase a block. A PE cycle involves a programming operation followed by an erase operation for data memory cells. In this case, the erase depth can still be too shallow when one, or only a few word lines, are programmed. On the other hand, if the minimum number of erase pulses is set high enough to satisfy the end-of-life erase condition for the block, this will cause unnecessary degradation by an excessively deep erase when the memory device is fresh.

Techniques provided herein address the above and other issues. In one approach, an erase technique is provided which erases a block to the same depth regardless of the number of programmed word lines. For example, all word lines may be programmed or only one or a few word lines may be programmed One aspect involves setting an erase-verify voltage for a first-programmed word line lower than for remaining word lines in a block. Since the first-programmed word line is always programmed when a block is erased, the erasing of the first-programmed word line can serve as a reference in the erasing of the block. The first-programmed word line is typically at the source side of a set of word lines in a block.

Moreover, when the erase-verify voltage is lowered, it is harder for the first-programmed word line to pass an erase-verify test, and the first-programmed word line will likely pass the test after other word lines in the block, regardless of whether the other word lines are programmed. The lower erase-verify voltage induces a larger-than-nominal channel resistance under the memory cells of the first-programmed word line which dominates the channel resistance of the other memory cells in a NAND string.

The erase operation does not require overhead data to be stored identifying the highest programmed word line or the number of programmed word lines in a block.

Another aspect involves optimizing the level of the erase-verify voltage for a first-programmed word line. Further, as program-erase cycles accumulate, the erase-verify voltage for a first-programmed word line and/or other word lines can be adjusted. Moreover, a difference between the erase-verify voltage of the first-programmed word line and the erase-verify voltage for the other word lines can be adjusted as a function of the number of PE cycles.

The following discussion provides details of the construction of example memory devices and of related techniques which address the above and other issues.

FIG. 1A is a perspective view of a 3D stacked non-volatile memory device. The memory device 100 includes a substrate 101. On the substrate are example blocks BLK0 and BLK1 of memory cells (storage elements) and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
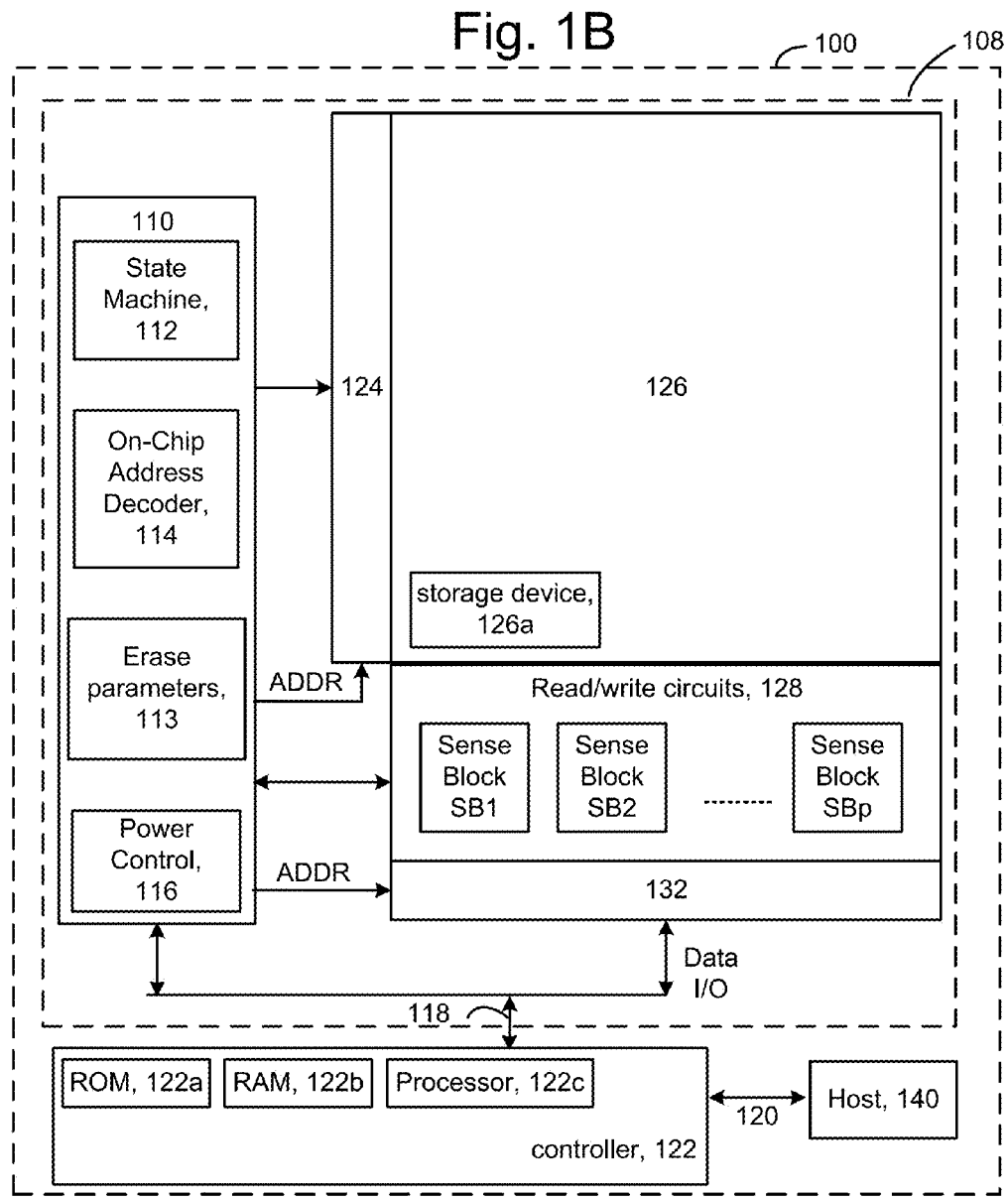
FIG. 1B is a functional block diagram of a memory device such as the 3D stacked non-volatile memory device 100 of FIG. 1A or the 2D memory devices of FIG. 5A to 5D.

FIG. 1B is a functional block diagram of a memory device such as the 3D stacked non-volatile memory device 100 of FIG. 1A or the 2D memory devices of FIG. 5A to 5D. The memory device 100 may include one or more memory die 108. The memory die 108 includes a memory structure 126 of memory cells, such as an array of memory cells, control circuitry 110, and read/write circuits 128. In a 3D configuration, the memory structure can include the blocks BLK0 and BLK1 of FIG. 1A. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120 and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided for erase parameters for the memory cells. These can include parameters for setting and adjusting the erase-verify voltages for the different word lines as described herein.

The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SB1, SB2, . . . , SBp, read/write circuits 128, controller 122, and so forth.

The off-chip controller 122 may comprise a processor 122c and storage devices (memory) such as ROM 122a and RAM 122b. The storage devices comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, FIG. 2 depicts example code which may be executed by the processor 122c. The code 150 is used by the controller to access the memory structure such as for programming, read and erase operations. The code can include boot code 151 and control code (set of instructions) 160. The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The set of instructions can include instructions for perform a plurality of erase-verify loops for a set of memory cells, wherein each erase-verify loop comprises an erase portion in which a positive channel-to-gate voltage is provided for each memory cell followed by a verify test in which a first verify voltage is applied to a first-programmed word line of a plurality of word lines and, concurrently, a second verify voltage, higher than the first verify voltage is applied to remaining word lines of the plurality of word lines (161).

Generally, the control code can include instructions to perform the functions described herein including the steps of the processes of FIGS. 8A and 8B.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

In a 3D stacked memory device, memory cells are formed along memory holes which extend through alternating conductive and dielectric layers in a stack. The memory cells are typically arranged in NAND strings. Each conductive layer can include one or more word line layers. A word line layer is an example of a word line.

Figure 3A:
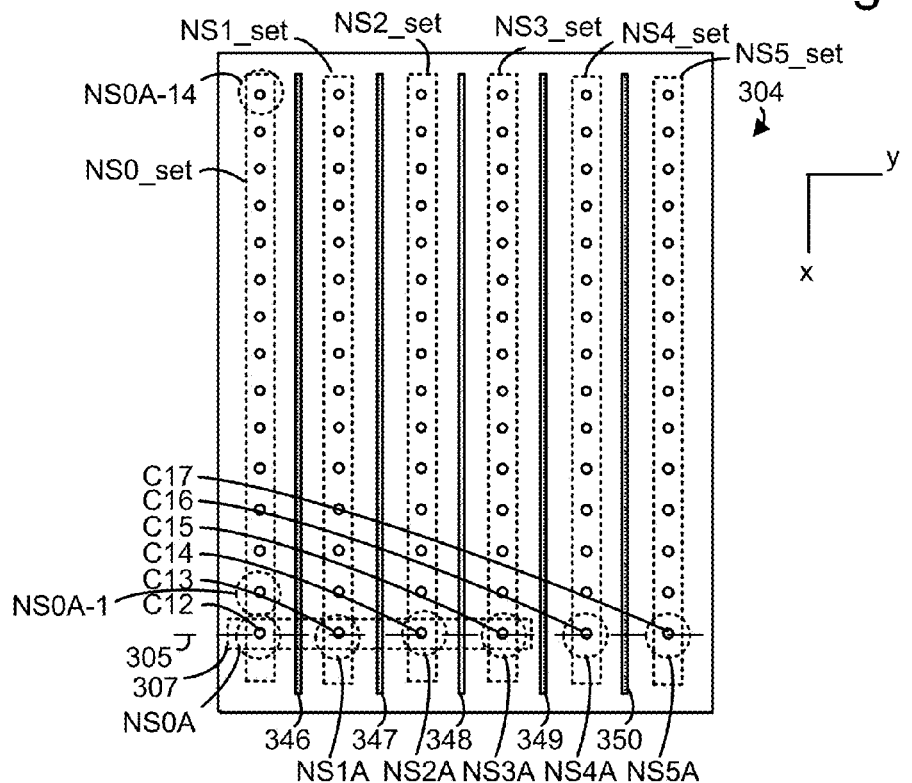
FIG. 3A depicts a top view of an example word line layer 304 of the block BLK0 of FIG. 1A, in a straight NAND string embodiment.

FIG. 3A depicts a top view of an example word line layer 304 of the block BLK0 of FIG. 1A, in a straight NAND string embodiment. In this configuration, a NAND string has only one column, and the source-side select gate is on the bottom of the column instead of on the top, as in a U-shaped NAND string. Moreover, a given level of a block has one WLL which is connected to each of the memory cells of the layer. Insulation-filled slits 346, 347, 348, 349 and 350 can also be used in the fabrication process to provide structural support for the stack when undoped polysilicon layers are removed by a wet etch and a dielectric is deposited to form the alternating dielectric layers. A dashed line 305 extends through columns C12-C17. A cross-sectional view along line 305 of portion 307 is shown in FIG. 3C1.

NS0_set, NS1_set, NS2_set, NS4_set, NS3_set and NS5_set represent the memory cells (as circles) of respective sets of NAND strings. For example, NS0_set represents memory cells in NAND strings NS0A, NS0A-1, . . . , NS0A-14. Additional NAND strings include NS1A, NS2A, NS3A, NS4A and NS5A.

Alternatively, the layer 304 represents an SGS layer, in which case each circle represents an SGS transistor.

The word line layers of FIG. 3A may represent any one of the word line layers in FIG. 3C. These conductive layers may include doped polysilicon or a metal such as tungsten or metal silicide, for instance.

Figure 3B:
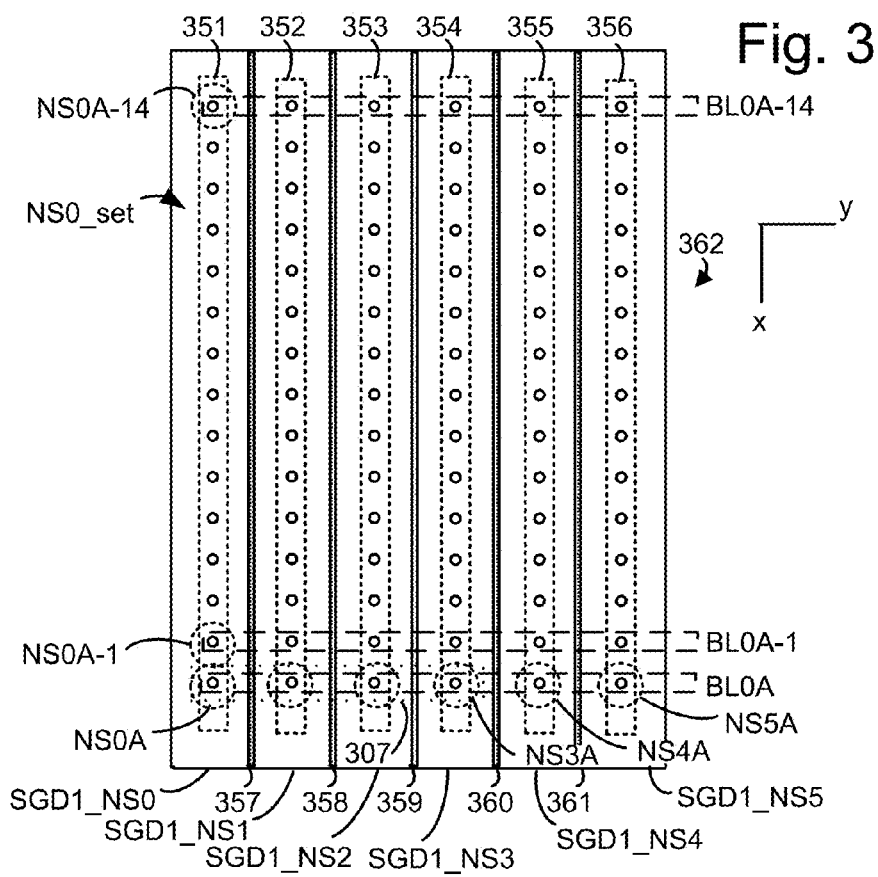
FIG. 3B depicts a top view of an example SGD layer 362, consistent with FIG. 3A.

FIG. 3B depicts a top view of an example SGD layer 362, consistent with FIG. 3A. Slits 357, 358, 359, 360 and 361 divide the SGD layer into portions SGD1_NS0, SGD1_NS1, SGD1_NS2, SGD1_NS3, SGD1_NS4 and SGD1_NS5. Each portion connects the SGD transistors in a set of NAND strings. For example, SGD layer portion SGD1_NS0 or line in the SGD layer SGD1 connects the SGD transistors in the set of NAND strings NS0A to NS0A-14. Regions 351, 352, 353, 354, 355 and 356 represent the SGD transistors (as circles) of respective sets of NAND strings in the SGD layer portions SGD1_NS0, SGD1_NS1, SGD1_NS2, SGD1_NS3, SGD1_NS4 and SGD1_NS5, respectively. The portion 307 from FIG. 3A is also repeated. The select gate transistors are associated with NAND strings NS0A-NS5A.

Example bit lines BL0A, BL0A-1, BL0A-14 extend in the y direction above rows of the NAND strings. For example, BL0A, shown also in FIG. 3C1, extends in the y direction above the NAND strings NS0A to NS5A.

FIG. 3C1 depicts an embodiment of a stack 376 showing a cross-sectional view of the portion 307 of FIG. 3A, along line 305, where two SGD layers, two SGS layers and four dummy word line layers DWLL1a, DWLL1b, DWLL2a and DWLL2b are provided. Columns of memory cells corresponding to NAND strings NS0A-NS3A are depicted in the multi-layer stack. The stack includes a substrate 101, an insulating film 250 on the substrate, and a portion of a source line SL0A. Additional straight NAND strings in a SGD line subset extend behind the NAND strings depicted in the cross-section, e.g., along the x-axis. NS0A has a source end SEa and a drain end DEa. The slits 346, 347 and 348 from FIG. 3A are also depicted. A portion of the bit line BL0A is also depicted. A conductive via 373 connects DEa to BL0A. The columns are formed in memory holes MH0-MH4. The memory holes are columnar and extend at least from a top 370 to a bottom 371 of the stack.

The source line SL0A is connected to the source ends of each NAND string. SL0A is also connected to other sets of memory strings which are behind these NAND strings in the x direction.

Word line layers, e.g., WLL0-WLL23, and dielectric layers, e.g., DL0-DL24, are arranged alternatingly in the stack. SGS transistors 369, 372, 374 and 375 are formed in the SGS1 layer.

A dummy memory cell, also referred to as a non-data memory cell, does not store data, while a data memory cell is eligible to store data. A word line connected to dummy memory cells is a dummy word line and a word line connected to data memory cells is a data word line or simply a word line. The dummy memory cells provide a transition region between a select gate and data memory cells to avoid an abrupt change in channel potential which can cause disturbs.

A region 246 of the stack is shown in greater detail in FIG. 4A. Regions D1a, D2a, D3a and D4a represent SGD transistors.

FIG. 3C2 depicts a variation in the width of a memory hole along its height. Due to the etching process used to create the memory holes, the cross-sectional width, e.g., diameter, of the memory hole can vary along its height. This is due to the very high aspect ratio. For example, a depth-to-diameter ratio of about 25-30 is common. Typically, the diameter becomes progressively smaller from the top to the bottom of the memory hole. In some case, a slight narrowing occurs at the top of the hole, as depicted, so that the diameter becomes slight wider before becoming progressively smaller from the top to the bottom of the memory hole.

Due to the non-uniformity in the width of the memory hole, and the width of the vertical pillar which is formed in the memory hole, the programming and erase speed of the memory cells can vary based on their position along the memory hole. With a smaller diameter memory hole, the electric field across the tunneling layer is stronger, so that the programming and erase speed is higher. The erase techniques herein are compatible with the fact. In one approach, the first-programmed word line is associated with the narrowest portion of the memory holes. However, the erase-verify level of the first-programmed word line can still be optimized as discussed herein.

In this case, the memory cells are arranged along vertically-extending memory holes (MH0-MH7) in the memory device, and a width of the vertically-extending memory holes varies along a height of the memory device.

Figure 3D:
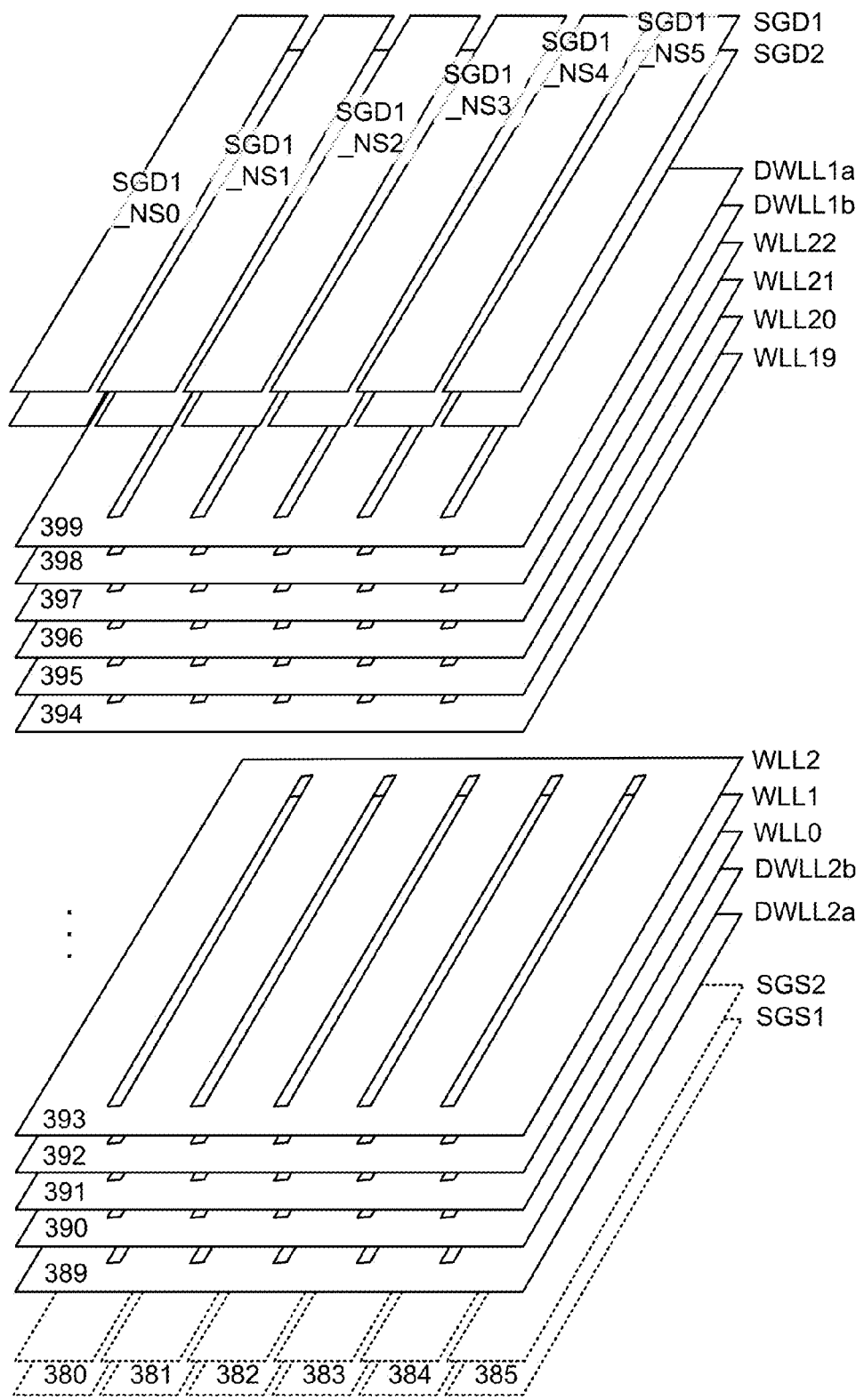
FIG. 3D depicts an alternative view of the select gate layers and word line layers of the stack 376 of FIG. 3C.

FIG. 3D depicts an alternative view of the select gate layers and word line layers of the stack 376 of FIG. 3C. The SGD layers SGD1 and SGD2 each includes parallel rows of select gate lines associated with the drain-side of a set of NAND strings. For example, SGD1 includes drain-side select gate lines SGD1_NS0, SGD1_NS1, SGD1_NS2, SGD1_NS3, SGD1_NS4 and SGD1_NS5, consistent with FIG. 3B. SGD2 can include similar drain-side select gate lines. Each select gate line can be independently controlled, in one approach.

Below the SGD layers are the word line layers. Each word line layer represents a word line, in one approach, and is connected to a set of memory cells at a given height in the stack. For example, DWLL1a, DWLL1b, WLL22, WLL21, WLL20 and WLL19 represent word lines 399, 398, 397, 396, 395 and 394, respectively. WLL2, WLL1, WLL0, DWLL2b and DWLL2a represent word lines 393, 392, 391, 390 and 389, respectively. Each word line can be controlled independently, in one approach.

Below the word line layers are the SGS layers. The SGS layers SGS1 and SGS2 each includes parallel rows of select gate lines associated with the source-side of a set of NAND strings. For example, SGS1 includes source-side select gate lines 380, 381, 382, 383, 384 and 385. Each select gate line can be independently controlled, in one approach.

In an example programming operation, the source-side word line 391 is a first-programmed word line and a drain-side word line 397 is a final programmed word line in a block.

FIG. 4A depicts a view of the region 246 of FIG. 3C1, showing SGD transistors D1a (consistent with FIG. 3C1) and D1a1 above dummy memory cells DMC1a and DMC1b and a data memory cell MC. A number of layers can be deposited along the sidewalls of the column and within each word line layer. These layers can include oxide-nitride-oxide (O-N-O) and polysilicon layers which are deposited, e.g., using atomic layer deposition. For example, the column includes a charge-trapping layer or film (CTL) 403 such as SiN or other nitride, a tunneling layer (TL) 404, a polysilicon body or channel (CH) 405, and a dielectric core (DC) 406. A word line layer includes a block oxide (BOx) 402, a block high-k material 401, a barrier metal 400, and a conductive metal such as W 399 as a control gate. For example, control gates CG1a, CG1a1, CG1a2, CG1a3 and CG1a4 are provided for the SGD transistors D1a and D1a1, the dummy memory cell DMC1a and DMC1b, and the memory cell MC, respectively. In another approach, all of these layers except the metal are provided in the column. Additional memory cells are similarly formed throughout the columns. The layers in the memory hole form a columnar active area (AA) of the NAND string.

When a memory cell is programmed, electrons are stored in a portion of the CTL which is associated with the memory cell. These electrons are drawn into the CTL from the channel, and through the tunneling layer (TL). The Vth of a memory cell is increased in proportion to the amount of stored charge. During an erase operation, the electrons return to the channel.

Each of the memory holes can be filled with a plurality of annular layers comprising a block oxide layer, a charge trapping layer, a tunneling layer and a channel layer. A core region of each of the memory holes is filled with a body material, and the plurality of annular layers are between the core region and the WLLs in each of the memory holes.

FIG. 4B1 depicts a cross-section view of the region 246 of FIG. 4A along line 444. Each layer is ring-shaped in one possible approach, except the core filler, which is a cylinder.

FIG. 4B2 depicts a close-up view of the tunneling layer 404 of FIG. 4B1, showing an oxide 404a, nitride 404b, oxide 404c configuration.

A charge-trapping memory device may use a charge-trapping material such as silicon nitride or other nitride, or in a multi-layer configuration such as an oxide-nitride-oxide (O—N—O) configuration. The charge-trapping material is separated from a channel layer by a tunneling layer. For example, a charge-trapping memory device may be a 3D memory device in which a stack of alternating conductive and dielectric layers are formed. Memory holes are etched in the stack and films are deposited in the holes such that memory cells or select gate transistors are formed where the conductive layers intersect with the memory holes. The films include a charge-trapping layer which extends vertically along an individual cell or an entire NAND string, a tunneling layer and a channel layer. Some of the conductive layers are used as control gates for memory cells and other conductive layers are used as control gates for select gate transistors, such as drain or source side transistors in NAND strings. Another example of a charge-trapping memory device is a 2D memory device in which the charge-trapping layer extends horizontally along a NAND string (FIGS. 5A and 5B).

Figure 5A:
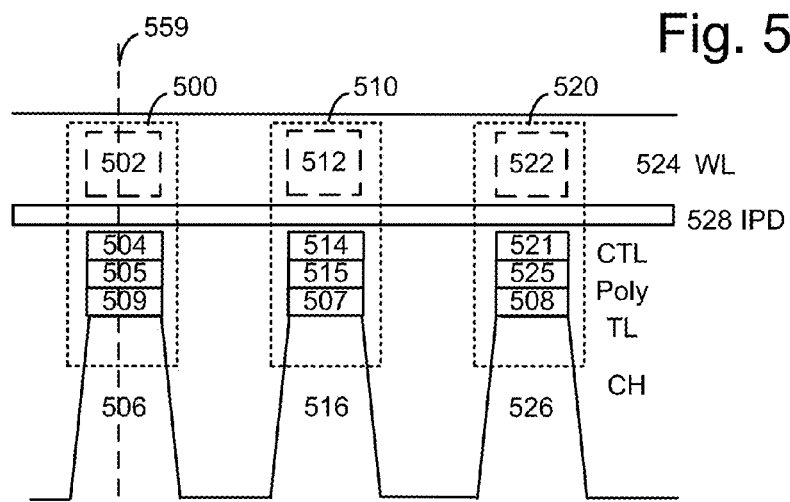
FIG. 5A depicts a cross-sectional view in a word line direction of memory cells comprising a flat control gate and charge-trapping regions as a 2D example of memory cells in the memory structure 126 of FIG. 1B.
Figure 5B:
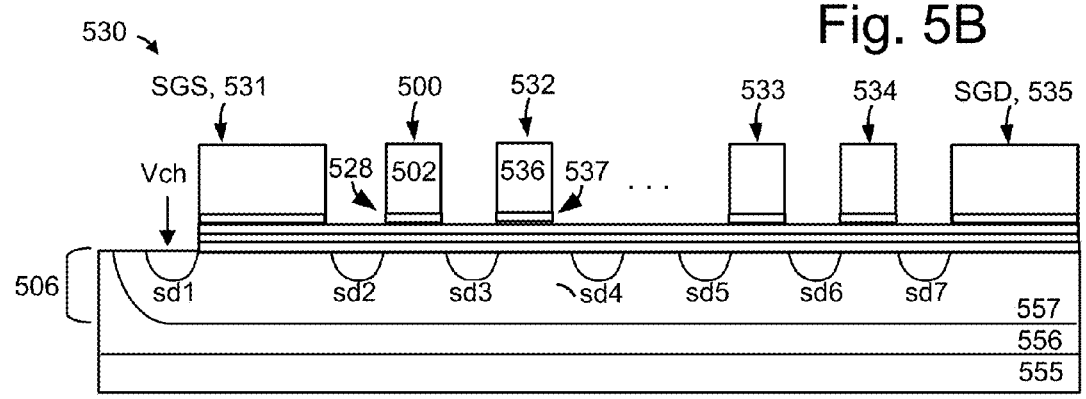
FIG. 5B depicts a cross sectional view along line 559 in FIG. 5A, showing a NAND string 530 having a flat control gate and a charge-trapping layer.

FIG. 5A depicts a cross-sectional view in a word line direction of memory cells comprising a flat control gate and charge-trapping regions a 2D example of memory cells in the memory structure 126 of FIG. 1B. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 524 extends across NAND strings which include respective channel regions 506, 516 and 526. Portions of the word line provide control gates 502, 512 and 522. Below the word line is an inter-poly dielectric (IPD) layer 528, charge-trapping layers 504, 514 and 521, polysilicon layers 505, 515 and 525 and tunneling layer (TL) layers 509, 507 and 508. Each charge-trapping layer extends continuously in a respective NAND string.

A memory cell 500 includes the control gate 502, the charge-trapping layer 504, the polysilicon layer 505 and a portion of the channel region 506. A memory cell 510 includes the control gate 512, the charge-trapping layer 514, a polysilicon layer 515 and a portion of the channel region 516. A memory cell 520 includes the control gate 522, the charge-trapping layer 521, the polysilicon layer 525 and a portion of the channel region 526.

Further, a flat control gate may be used instead of a control gate that wraps around a floating gate. One advantage is that the charge-trapping layer can be made thinner than a floating gate. Additionally, the memory cells can be placed closer together.

FIG. 5B depicts a cross sectional view along line 559 in FIG. 5A, showing a NAND string 530 having a flat control gate and a charge-trapping layer. The NAND string 530 includes an SGS transistor 531, example memory cells 500, 532, . . . , 533 and 534, and an SGD transistor 535. In one option, the SGD transistor can be biased to produce GIDL during an erase operation, as discussed primarily in connection with the 3D memory device. In another option, the substrate can be biased directly to provide a channel voltage, while the word lines are biased at a negative voltage.

The NAND string may be formed on a substrate which comprises a p-type substrate region 555, an n-type well 556 and a p-type well 557. N-type source/drain diffusion regions sd1, sd2, sd3, sd4, sd5, sd6 and sd7 are formed in the p-type well 557. A channel voltage, Vch, may be applied directly to the channel region of the substrate. The memory cell 500 includes the control gate 502 and an IPD portion 528 above the charge-trapping layer 504, the polysilicon layer 505, the tunneling layer 509 and the channel region 506. The memory cell 532 includes a control gate 536 and an IPD portion 537 above the charge-trapping layer 504, the polysilicon layer 505, the tunneling layer 509 and the channel region 506.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance. A difference between a floating gate memory cell and the flat memory cell is the height of the charge storage layer. A typically floating gate height may be about 100 nm, while a charge-trapping layer can be as small as 3 nm, and the polysilicon layer can be about 5 nm.

The SGD and SGS transistors have the same configuration as the memory cells but with a longer channel length to ensure that current is cutoff in an inhibited NAND string.

In this example, the layers 504, 505 and 509 extend continuously in the NAND string. In another approach, portions of the layers 504, 505 and 509 which are between the control gates 502, 512 and 522 can be removed, exposing a top surface of the channel 506.

One or more dummy memory cells may be provided adjacent to the select gate transistors.

Figure 6A:
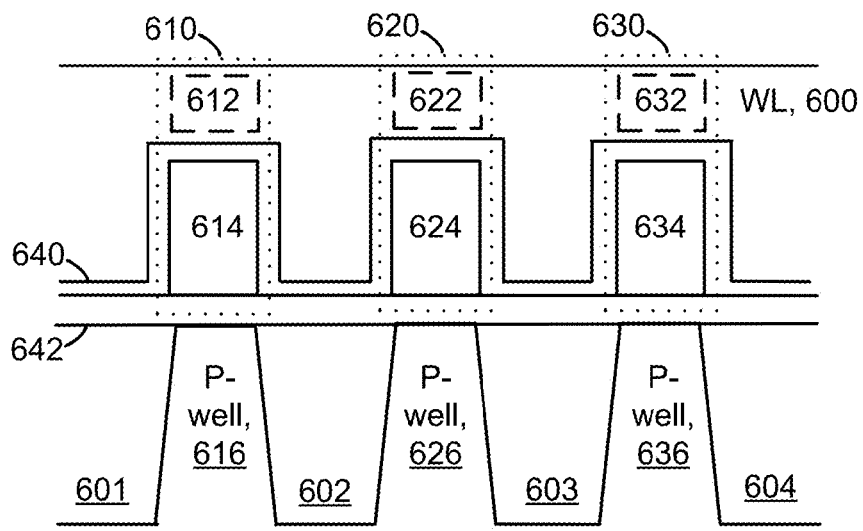
FIG. 6A depicts a cross-sectional view in a word line direction of memory cells comprising floating gates as another 2D example of memory cells in the memory structure 126 of FIG. 1B.

FIG. 6A depicts a cross-sectional view in a word line direction of memory cells comprising floating gates as another 2D example of memory cells in the memory structure 126 of FIG. 1B. The cross section depicts a control gate (CG) or word line 600 which extends across multiple memory cells in a word line direction. Each memory cell includes a control gate and a floating gate (FG) which is over a respective channel area of the substrate, typically in a p-well. For example, memory cells 610, 620 and 630 include control gates 612, 622 and 632, respectively, and floating gates 614, 624 and 634, over p-well channel regions 616, 626 and 636, respectively. Each channel region is part of a NAND string which can be visualized as coming out of the page, in a bit line direction which is orthogonal to the word line direction. The p-well regions are separated by shallow trench isolation regions 601, 602, 603 and 604. An inter-poly dielectric (IPD) material 640 may be provided between each control gate and floating gate, while a tunnel oxide layer 642 is provided between each floating gate and a substrate region.

The erase techniques provided herein can be used with a memory that transfers charges, such as NAND flash memory, Metal-Oxide-Nitride-Oxide-Semiconductor (MONOS), Silicon-Oxide-Nitride-Oxide-Silicon (SONOS) or any charge-trapping type of memory.

Figure 6B:
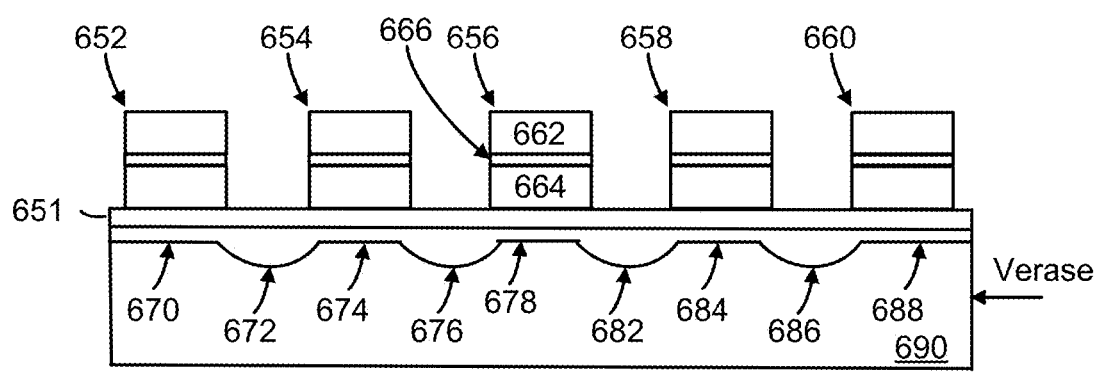
FIG. 6B depicts a cross-sectional view of the NAND string of FIG. 6A.

FIG. 6B depicts a cross-sectional view of the NAND string of FIG. 6A. The NAND string includes example memory cells 652, 654, 656, 658 and 660 formed on a tunnel oxide 651 on substrate 690. The memory cells include a control gate, floating gate and inter-poly dielectric (IPD). For example, the memory cell 656 has a control gate 662, IPD 666 and floating gate 664. During an erase operation, conductive channel regions are formed under the memory cells. Specifically, a conductive channel region 670 forms under the memory cell 652 between the source/drain region 672 and another source/drain region, not shown, a conductive channel region 674 forms under the memory cell 654 between the source/drain regions 672 and 676, a conductive channel region 678 forms under the memory cell 656 between the source/drain regions 676 and 682, a conductive channel region 684 forms under the memory cell 658 between the source/drain regions 682 and 686, and a conductive channel region 688 forms under the memory cell 660 between the source/drain region 686 and another source/drain region, not shown. An erase voltage, Verase, is applied to the substrate 690.

Figure 7A:
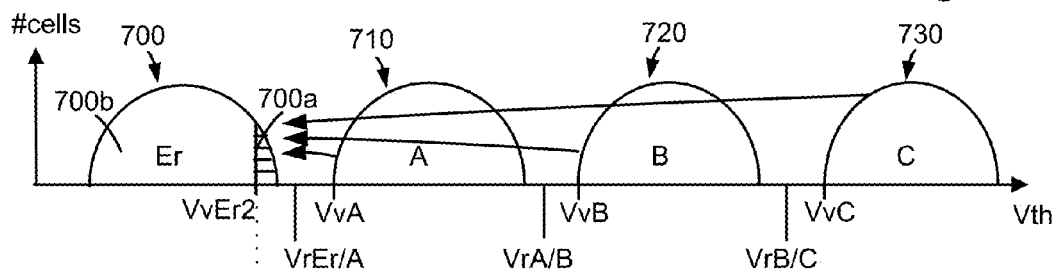
FIG. 7A depicts an example Vth distribution of data memory cells with four data states in an erase operation which uses a second erase-verify voltage VvEr2 for all word lines in a block.
Figure 7B:
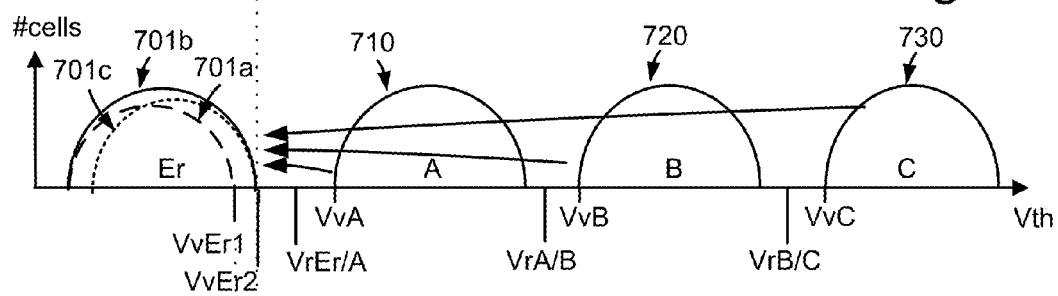
FIG. 7B depicts an example Vth distribution of data memory cells with four data states in an erase operation which uses a first erase-verify voltage VvEr1 for a first-programmed word line and the second erase-verify voltage VvEr2 for remaining word lines in the block.
Figure 7C:
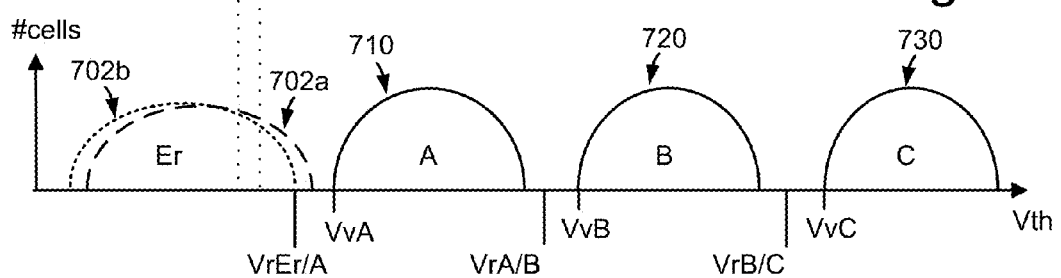
FIG. 7C depicts an example Vth distribution of data memory cells with four data states, showing Vth distributions 702a and 702b which correspond to the Vth distribution 700 (FIG. 7A) and 701b (FIG. 7B), respectively, with the addition of program disturb.

In FIG. 7A to 7C, the horizontal axis depicts Vth and the vertical axis depicts a number of memory cells on a logarithmic scale.

FIG. 7A depicts an example Vth distribution of data memory cells with four data states in an erase operation which uses a second erase-verify voltage VvEr2 for all word lines in a block. Example Vth distributions for the memory cell array are provided for a case where each memory cell stores two bits of data in one of four possible Vth ranges. One bit represents the lower data and the other bit represents the upper page data.

A first Vth distribution 700 is provided for erased (Er) state memory cells. Three Vth distributions 710, 720 and 730 represent target data states A, B and C, respectively, which are reached by memory cells when their Vth exceeds the erase-verify voltage VvA, VvB or VvC, respectively.

A programming operation can use one or more programming pass operation. A one pass programming operation involves (only) one sequence of multiple program-verify operations (or program loops) which are performed starting from an initial Vpgm level and proceeding to a final Vpgm level until the threshold voltages of a set of selected memory cells reach one or more respective verify voltages of respective target data states. All memory cells may initially be in the erased state at the beginning of the programming pass. For example, see FIG. 9.

After the programming pass is completed, the data can be read from the memory cells using read reference voltages VrEr/A, VrA/B and VrB/C which are between the Vth distributions. At the same time, a read pass voltage, Vread (e.g., 8-9 V), is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

An erase operation involves one or more erase-verify loops which lower the Vth of the memory cells. The erase operation may cause the programmed memory cells to transition from the Vth distributions 710, 720 and 730 to the Vth distribution 700 which includes a region 700a representing memory cells with Vth>VvEr2 and a region 700b representing memory cells with Vth<VvEr2. Some memory cells are in the erased state at the start of the programming operation.

In particular, the region 700a represents memory cells with a relatively shallow erase depth. This region typically represents the programmed memory cells of the higher data states, e.g., the C state. The region 700b represents memory cells with a relatively deep erase depth. This region typically represents the programmed memory cells of the lower data states, e.g., the A and B states and the erased state cells.

FIG. 7B depicts an example Vth distribution of data memory cells with four data states in an erase operation which uses a first erase-verify voltage VvEr1 for a first-programmed word line and the second erase-verify voltage VvEr2 for remaining word lines in the block. In this example, VvEr1<VvEr2. This results in Vth distribution 701a for the first-programmed word line, a Vth distribution 701c for the remaining word lines and an overall Vth distribution 701b. VvEr1 is a first verify voltage which is applied to the particular, first-programmed word line and VvEr2 is a second verify voltage, higher than the first verify voltage which is applied concurrently to the remaining word lines, during an erase-verify test.

FIG. 7C depicts an example Vth distribution of data memory cells with four data states, showing Vth distributions 702a and 702b which correspond to the Vth distribution 700 (FIG. 7A) and 701b (FIG. 7B), respectively, with the addition of program disturb. As mentioned, the Vth distribution of memory cells of a give data state can increase over time due to program disturb, and the erased state memory cells are most susceptible to this problem. The upper tail of the Vth distribution 702a is above the read voltage VrEr/A so that the associated memory cells will be read incorrectly as representing the A state. The use of error correction codes (ECC) may not be able to resolve these errors, so that uncorrectable errors occur. On the other hand, the upper tail of the Vth distribution 702b is below VrEr/A so that the associated memory cells will be read correctly as representing the erased state. This situation is achieved by erasing the memory cell to a sufficient depth with particular attention paid to the upper tail of the Vth distribution.

FIG. 8A depicts an example process for programming and erasing memory cells in a block. Step 800 includes programming memory cells of one or more word lines in a block of NAND strings. The programming can occur according to a word line programming order in which the lowest word line, e.g., WL0, is programmed first. Optionally, other word lines, e.g., WL1, WL2 and so forth are programmed successively after WL0. The programming can occur in response to a programming command involving a set of memory cells arranged in a plurality of NAND strings and connected to a plurality of word lines. For example the command can be issued by the state machine or other control circuit.

Step 801 includes optional reading and/or additional programming of the block. For example, the additional programming can program memory cells in word lines which were not previously programmed since a last erase operation for the block.

Step 802 begins an erase operation comprising erase-verify loops for the block. The erase operation can occur in response to an erase command involving a set of memory cells arranged in a plurality of NAND strings and connected to a plurality of word lines. For example the command can be issued by the state machine or other control circuit. Step 803 begins an erase-verify loop. Step 804 includes, in an erase portion of the erase-verify loop, applying voltages to provide a positive channel-to-gate voltage for each memory cell of the block. Various biasing schemes are discussed further below. Typically, the bit line, source line and/or control gate voltages can be set in a 3D memory device while a substrate/p-well voltage can also be set in a 2D memory device. In one approach, each memory cell is provided with the same channel-to-gate voltage.

At step 805, in a verify test of the erase-verify loop, the method applies a first verify voltage to a first-programmed word line (e.g., one word line) of the block and a second verify voltage to remaining word lines of the bloc, regardless of whether the remaining word lines comprise programmed memory cells. Step 810 optionally optimizes the erase-verify voltages for step 805. Step 806 includes sensing currents in the NAND strings. For example, each NAND string may be connected to a respective sense circuit via a respective bit line. See FIG. 12A. A decision step 807 determines if a completion criterion is met based on step 806. For example, the completion criterion may be met if all, or at least a specified portion of the NAND strings in a block, e.g., 90%, have a current above a reference level and are thus in a conductive state. The current in each NAND string can be compared to a reference current in a verify test that occur for each NAND string of a set of NAND strings. If decision step 807 is true, the erase operation is completed at step 809. If decision step 807 is false, step 808 steps up the erase voltage and a next erase-verify loop begins at step 803.

In one approach, the erase-verify test is performed for a set of NAND strings which are connected to a common SGD line. The erase-verify test can be performed for one set of NAND strings, then another set of NAND strings, and so forth. The erase voltages may be applied to the different sets of NAND strings concurrently. An erase operation can involve one or more sets of NAND strings in a block.

FIG. 8B depicts an example optimization process for setting a verify voltage, consistent with step 810 of FIG. 8A. The adjustment process can be performed at different times, including at the manufacturing stage before the memory device is in the control of the end user, and after the memory device is in the control of the end user. In one approach, the adjustment process is repeated at milestones in a number of PE cycles, e.g., 5K, 10K, . . . . This ensures that the erase-verify voltage is optimized throughout the lifetime of the memory device. Or, there may be no need to repeat the adjustment process. Step 820 begins an adjustment process for the erase-verify voltage, e.g., for the first-programmed word lines and/or remaining word lines.

Step 821 programs memory cells of all data word lines in a block of NAND strings. The memory cells on each word line can store data which is randomly distributed among the different data states, for instance. Step 822 includes performing an erase operation for the block using a common erase-verify voltage for all word lines. Step 823 counts a number of loops NLref used to complete the erase operation of step 822. For example, NLref=3 loops. Step 824 sets an initial value for a lower erase-verify voltage for the first-programmed word line. For example, this can be lower than the common erase-verify voltage of step 822. In one approach, the initial value is set based on, and proportional to, NLref. For example, the initial value can be relatively lower when NLref is relatively lower (indicating a fresh memory device). For instance, for a fresh memory device, the initial value may need to be lower to achieve NLi=NLref in decision step 828. Step 825 programs memory cells of only the first-programmed word line in the block of NAND strings. Step 826 includes performing an erase operation for the block using the lower erase-verify voltage for the first-programmed word line and the common erase-verify voltage for the remaining word lines of a block, e.g., WLL1-WLL22 in FIG. 3D. Step 827 counts a number of loops NLi used to complete the erase operation of step 826, where i is an index representing an ith adjustment to the erase-verify voltage, e.g., i=1, 2, 3 . . . .

A decision step 828 determines if NLi=NLref. If this is true, the erase operation is completed and the current value of the lower erase-verify voltage is optimal. A value of the voltage is recorded for use in subsequent erase operations (step 829). For example, the set of memory cells can be on a chip, and the method can include configuring the memory device to apply a first value of an optimized verify voltage by storing the first value of the optimized verify voltage in a storage location on the chip (e.g., storage location 113 in FIG. 1B). If decision step 828 is false, a decision step 830 determines if NLi<NLref. If this is true, step 831 sets a lower value of the erase-verify voltage of the first-programmed word line and step 825 is repeated. This lower value causes a deeper erase of WL0 which requires more erase loops. If decision step 830 is false, NLi>NLref at step 832, step 833 sets a higher value of the erase-verify voltage of the first-programmed word line and step 825 is repeated. This higher value causes a shallower erase of WL0 which requires fewer erase loops.

The process can iteratively determine an optimal value of the erase-verify voltage for the first-programmed word line. In one approach, this value results in a same number of erase loops compared to the case where a common erase-verify voltage is used on all word lines and all word lines are programmed. This allows for a uniform erase depth regardless of the number of programmed word lines, without increasing the number of erase loops.

Figure 9:
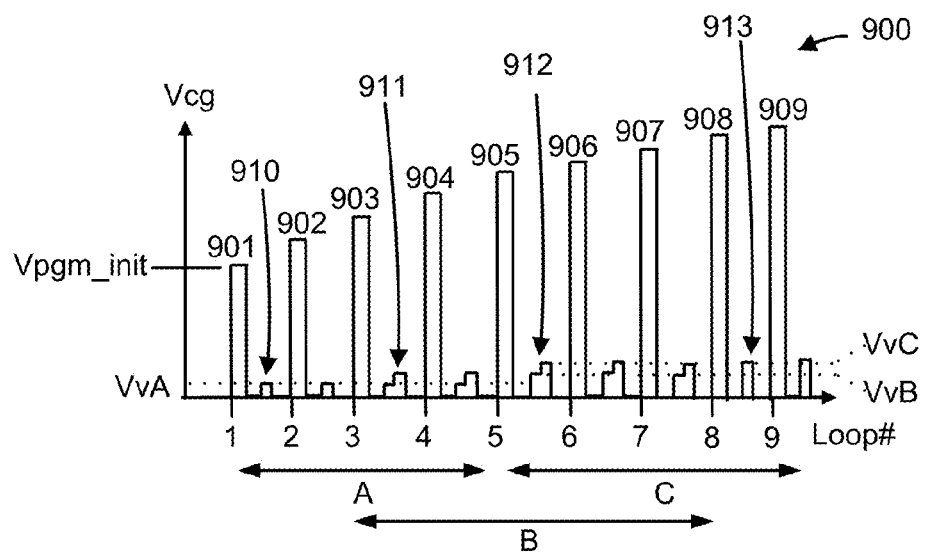
FIG. 9 depicts voltages applied to a word line in an example programming operation consistent with step 800 of FIG. 8A and steps 821 and 825 of FIG. 8B.

FIG. 9 depicts voltages applied to a word line in an example programming operation consistent with step 800 of FIG. 8A and steps 821 and 825 of FIG. 8B. A one pass programming operation with four data states is depicted. Other options are possible. The programming operation comprises a series of waveforms 900. Incremental step pulse programming is performed for each target data state. This example also performs verify tests based on the program loop. For example, the A, B and C state cells are verified in loops 1-4, 3-7 and 5-9, respectively. An example verify waveform 910 comprises an A state verify voltage at VvA. An example verify waveform 911 comprises A and B state verify voltages at VvA and VvB, respectively. An example verify waveform 912 comprises B and C state verify voltages at VvB and VvC, respectively. An example verify waveform 913 comprises a C state verify voltage at VvC. The program voltages (pulses) 901-909 are also depicted. An initial program pulse has the magnitude of Vpgm_init. A program pulse is a waveform that increases from an initial value, e.g., 0 V, to a peak value, in one or more steps, and then back to the initial value, typically.

FIG. 10A depicts example voltages in an erase operation consistent with step 804 of FIG. 8A and steps 822 and 826 of FIG. 8B, wherein the erase operation uses gate-induced drain leakage (GIDL) to charge up the channel of a NAND string.

The vertical axis depicts voltage and the horizontal axis depicts time. The waveform 1000 depicts a series of bit line and/or source line voltages 1001, 1003 and 1005 with magnitudes of Verase1a, Verase2a and Verase3a, respectively, which step up in each erase-verify iteration. The waveform also depicts select gate voltages 1002, 1004 and 1006 with a common magnitude of Vsg_er, in one approach. In another approach, the select gate voltage also steps up with the bit line and/or source line voltage. The waveform provides a number of erase-verify loops EV1a, EV2a and EV3a, each of which includes an erase portion and a verify portion (verify test). The channel of a NAND string can be charged up in an erase operation based on GIDL, which is generated in proportion to the drain-to-gate voltage of the select gate transistors at the drain-end and/or source-end of the NAND sting. In another option, the erase voltage steps up to its peak in two steps instead of one to allow time for the charge up of the channel to occur. In another option, the erase voltage and the select gate voltage both step up to their peaks in two steps. This approach is particularly suitable for a 3D memory device.

FIG. 10B depicts an example channel voltage consistent with FIG. 10A. FIG. 10B is time-aligned with FIG. 10A. The channel voltage (Vch) in represented by a waveform 1010 which has elevated portions 1011, 1012 and 1013 coincident with the elevated voltages of FIG. 10A. In the approach of FIGS. 10A and 10B, the word line voltage is at a level, e.g., 0 V or close to 0 V, which provides a positive channel-to-gate voltage.

FIG. 10C depicts example erase voltages in an erase operation consistent with step 804 of FIG. 8A and steps 822 and 826 of FIG. 8B, wherein the erase operation applies a positive voltage to a p-well of a substrate. This approach is particularly suitable for a 2D memory device. The waveform 1020 comprises voltage pulses 1021, 1022 and 1023 with amplitudes of Verase1b, Verase2b and Verase3b, respectively, which can step up in each loop. The voltage pulses are in erase-verify loops EV1b, EV2b and EV3b. The word line voltage may be at a level, e.g., 0 V or close to 0 V, which provides a positive channel-to-gate voltage.

FIG. 10D depicts example erase voltages in an erase operation consistent with step 804 of FIG. 8A and steps 822 and 826 of FIG. 8B, wherein the erase operation applies a negative voltage to the word lines in a block. In this approach, the memory device has the capability to apply a negative voltage on the word lines, such as by using a negative charge pump. In one approach, the drain (bit line) and source can be set at 0 V, and there is a positive source-to-control gate voltage of the memory cells. The waveform 1030 depicts a series of negative control gate voltages 1031, 1032 and 1033 with magnitudes of Verase1c, Verase2c and Verase3c, respectively, in erase-verify loops EV1c, EV2c and EV3c, respectively.

FIG. 10E depicts example verify voltages in an erase operation consistent with step 807 of FIG. 8A and steps 822 and 826 of FIG. 8B and with VvEr1 and VvEr2 in FIG. 7B. FIG. 10E is time aligned with FIG. 10A to 10D and can be used with any of these waveforms to provide the verify test of an erase-verify loop. The waveform 1040 includes voltage pulses 1041a, 1042a or 1043a at VvEr2 which are applied to the remaining word lines and voltage pulses 1041b, 1042b or 1043b at VvEr1 which are applied to the first-programmed word line. The erase-verify voltages can be small positive values, 0 V, or negative values.

FIG. 11 depicts a circuit diagram of example NAND strings NS0A and NS0A-1 consistent with the memory devices of FIG. 3A to 3D. Example NAND strings are NS0A and NS0A-1. The word lines for data memory cells are WLL0-WLL21. WLL0-WLL21 are connected to data memory cells 1127-1105, respectively, in NS0A and to data memory cells 1167-1145, respectively, in NS0A-1. Dummy word lines DWLL1a, DWLL1b, DWLL2b and DWLL2a are connected to dummy memory cells 1103, 1104, 1128 and 1129, respectively, in NS0A and to dummy memory cells 1143, 1144, 1168 and 1169, respectively, in NS0A-1. The word lines are connected to both the selected and unselected NAND strings. An SGD line, SGD1_NS0 is connected to the SGD transistors 1101 and 1141 while an SGD line, SGD2_NS0 is connected to the SGD transistors 1102 and 1142.

An SGS line, SGS1 is connected to the SGS transistors 1131 and 1171, and an SGS line, SGS2 is connected to the SGS transistors 1130 and 1170.

A channel of NS0A is ch_NS0A and a channel of NS0A-1 is ch_NS0A-1. A current in the channel of NS0A is sensed by sensing circuitry (SC) 1100 via a bit line BL0A which is at a voltage, Vb1. A current in the channel of NS0A-1 is sensed by sensing circuitry (SC) 1190 via a bit line BL0A-1 which is at a voltage, Vb1.

A source line 1181 is connected to source ends of the NAND strings. Voltage drivers can be used to provide voltages on the control lines (e.g., word lines, select gate lines, bit line and source line).

Memory cells 1127 and 1167 are first-programmed memory cells in NS0A and NS0A-1, respectively, and WLL0 is a first-programmed word line. Remaining memory cells of word lines 1195 are after WLL0 in a word line programming order.

FIG. 12A depicts a configuration of the NAND string NS0A and the sensing circuitry 1100 of FIG. 11 with components for erase-verify sensing. As discussed, NS0A includes memory cells which are in communication with word lines WLL0, WLL1, WL22, respectively. Further, additional NAND strings are typically arranged adjacent to one another in a block or other set of non-volatile memory cells. The memory cells are coupled to a p-well region 1210 of a substrate in this example but the example is applicable generally to a 3D memory device as well which does not have such a p-well. A bit line BL0A having a voltage Vb1 is depicted, in addition to sensing circuitry 1100, which can be provided by the sense block SB1, . . . , SBp of FIG. 1B.

A BLS (bit line sense) transistor 1206 which is coupled to the bit line 710 is a high voltage transistor which is made conductive in response to a control 1208 during sense operations. The control can be provided by any of the control circuits discussed in connection with FIG. 1B, for instance. A BLC (bit line clamp) transistor 1204 is a low voltage transistor which is opened in response to the control to allow the bit line to communicate with a current sensing module 1202. During a sense operation, such as an erase-verify test, a pre-charge operation occurs in which a capacitor in the current sensing module is charged. The BLC transistor may be made conductive to allow the pre-charging. Also during the sense operation, specified erase-verify voltages are applied to the word lines.

In an erase operation, an entire block may receive a common erase pulse. The verify operation can determine whether each NAND string is conductive. In one approach, all NAND strings are verified concurrently. In another possible approach, even-numbered NAND strings are verified separately from odd-numbered NAND strings. If all NAND strings are not conductive, an additional erase pulse can be applied. Moreover, for a given NAND string, each memory cell must be conductive in order for the entire NAND string to be conductive, since the memory cells are series-connected in a NAND string.

When the erase-verify voltage is applied, a positive voltage Vs1 can be applied to the source side of the NAND string and a positive voltage Vp-well can be applied to the p-well. At the drain side of the NAND string, the BLS transistor is made conductive. Additionally, a voltage Vb1c is applied to the BLC transistor to make it conductive. The pre-charged capacitor in the current sensing module discharges through the bit line and into the source so that the source acts as a current sink, when the NAND string is conductive, e.g., when the threshold voltages of all memory cells of the NAND string have reached below the erase-verify level. This is represented by the current I_NS0A. If the threshold voltage of one or more of the memory cells in the NAND string has not reached below the erase-verify level, little no current will flow in the NAND string.

The capacitor at the drain of the NAND string may be pre-charged to a potential which exceeds a potential of the source so that a current flows through the selected non-volatile memory cell and sinks into the source when each memory cell of the NAND string is in the conductive state.

The current sensing module can sense the cell/memory cell current. In one possible approach, the current sensing module determines a voltage drop which is tied to a fixed current flow by the relationship $\Delta V = i_{CELL} \cdot t/C$, where $\Delta V$ is the voltage drop, $i_{CELL}$ is the fixed current, t is a predetermined discharge time period and C is the capacitance of the pre-charged capacitor in the current sensing module. A greater voltage drops represent higher currents. At the end of a given discharge period, since $i_{CELL}$ and C are fixed, $\Delta V$ for a given current can be determined. If the discharge is sufficiently large in a specified time, the NAND string is deemed to be conductive, so that each memory cell is also conductive. That is, the threshold voltage of each memory cell has reached below the erase-verify level. The current sensing module thus can determine whether the associated NAND string is in a conductive or non-conductive state by the level of current.

In one approach, a p-mos transistor is used to determine a level of $\Delta V$ relative to a reference value. In another possible approach, a cell current discriminator serves as a discriminator or comparator of current levels by determining whether the conduction current is higher or lower than a given reference current.

FIG. 12B depicts the example memory cell 1127 of FIG. 12A. The memory cell comprises a control gate CG which receives a word line voltage Vwl10, a drain at a voltage Vd, a source at a voltage Vs and a channel at a voltage Vch.

FIG. 12C depicts a plot of Vth versus I_NS0A, a current in NS0A during an erase-verify test, consistent with step 807 of FIG. 8A and steps 822 and 826 of FIG. 8B. An erase operation can include a number of erase-verify iterations which are performed until the erase operation is completed. An erase-verify iteration includes an erase portion in which an erase voltage is applied, followed by a verify test. While it possible to verify memory cells in one or more selected word lines, typically an entire block is erased, in which case the verification can be performed concurrently for all memory cells in one or more NAND strings. During a verify operation for the memory cells of a NAND string, an erase-verify voltage is applied to the control gates of the memory cells while a bit line voltage is supplied using sensing circuitry. The select gate transistors and dummy memory cells are provided in a conductive state and act as pass gates. A current in the NAND string is detected and compared to a reference current, e.g., using a current comparison circuit. If the current in the NAND string exceeds the reference current, this indicates the cells in the NAND string are in a conductive state, so that their Vth, on average, is below the erase-verify level. That is, the NAND string passes the erase-verify test. On the other hand, if the current in the NAND string does not exceed the reference current, this indicates the cells in the NAND string are in a non-conductive state, so that their Vth, on average, is above the erase-verify voltage. That is, not all of the cells in the NAND string are erased and the NAND string does not pass the erase-verify test.

For a set of NAND strings, the erase operation can be considered to be completed when all, or at least a specified majority, of the NAND strings pass the erase-verify test. If the erase operation is not completed after an erase-verify iteration, another erase-verify iteration can be performed using a stronger erase voltage.

Figure 13A:
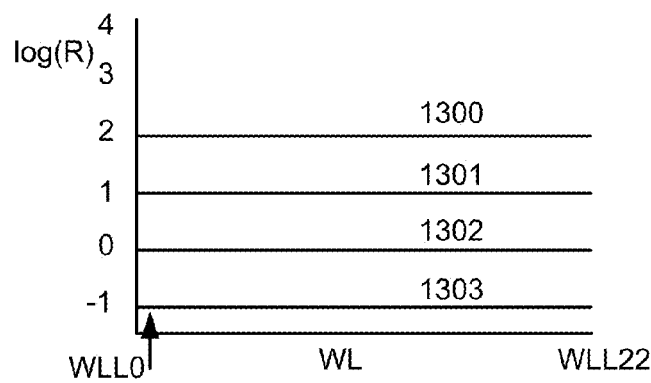
FIG. 13A depicts a plot of resistance of a memory cell on a logarithmic scale verses word line position in an erase operation, for a case where all word lines are programmed and use a common erase-verify voltage.

FIG. 13A depicts a plot of resistance (R) of a memory cell on a logarithmic scale verses word line position in an erase operation, for a case where all word lines are programmed and use a common erase-verify voltage. The resistance represents the typical resistance of the channel region of a memory cell on a word line at different times in the erase operation. For example, the plots 1300, 1301, 1302 and 1303 are resistances at the start of an erase operation, and after one, two or three erase-verify loops, respectively. In this example, the resistance starts, and decreases uniformly, across the word lines. However, as mentioned, this can lead to an inadequate erase depth when most of the word lines are not programmed. The resistance units are arbitrary, but the plot shows how there is a logarithmic decrease in resistance after each erase-verify loop.

Figure 13B:
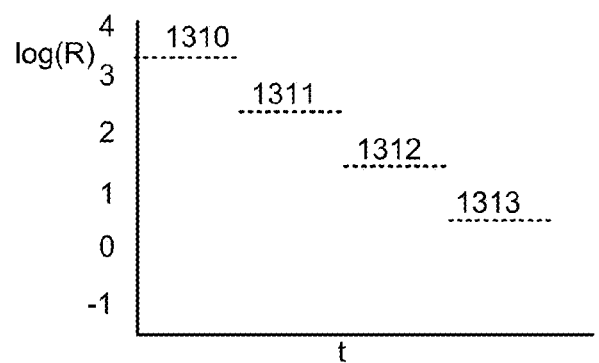
FIG. 13B depicts a plot of resistance of a NAND string on a logarithmic scale verses time, consistent with FIG. 13A.

FIG. 13B depicts a plot of resistance of a NAND string on a logarithmic scale verses time, consistent with FIG. 13A. Plots 1310, 1311, 1312 and 1313 show the resistance of an example NAND string which comprises one memory cell from each word line. The resistance decreases logarithmically after each erase-verify loop.

Figure 13C:
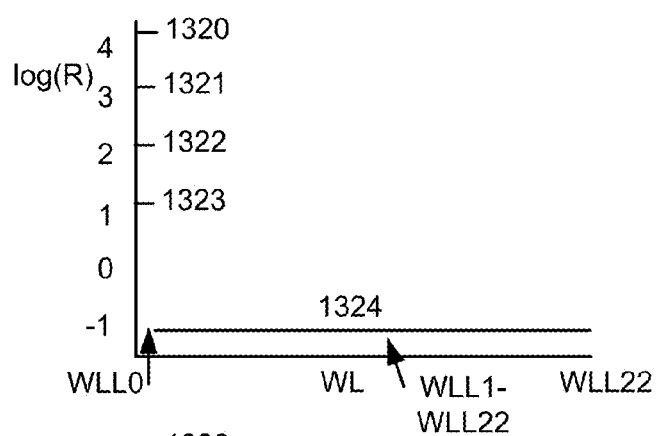
FIG. 13C depicts a plot of resistance of a memory cell on a logarithmic scale verses word line position in an erase operation, for a case where WLL0 is programmed and uses a lower erase-verify voltage than the remaining word lines.

FIG. 13C depicts a plot of resistance of a memory cell on a logarithmic scale verses word line position in an erase operation, for a case where WLL0 is programmed and uses a lower erase-verify voltage than the remaining word lines, which are not programmed Plots 1320, 1321, 1322 and 1323 show the relatively high resistance of a memory cell on WLL0 at the start of an erase operation, and after one, two or three erase-verify loops, respectively. The resistance of the memory cell on WLL0 dominates over the resistance (plot 1324) of the remaining memory cells (WLL1-WLL22) of the NAND string, which are not programmed.

Figure 13D:
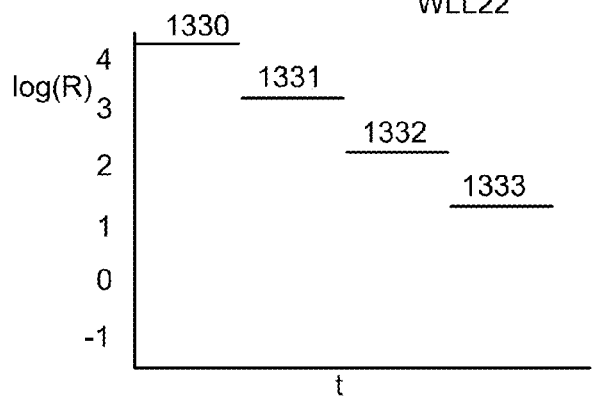
FIG. 13D depicts a plot of resistance of a NAND string on a logarithmic scale verses time, consistent with FIG. 13C.

FIG. 13D depicts a plot of resistance of a NAND string on a logarithmic scale verses time, consistent with FIG. 13C. Plots 1330, 1331, 1332 and 1333 show the resistance of an example NAND string which comprises one memory cell from each word line. The resistance decreases logarithmically after each erase-verify loop, similar to FIG. 13B but at higher resistance levels.

Figure 13E:
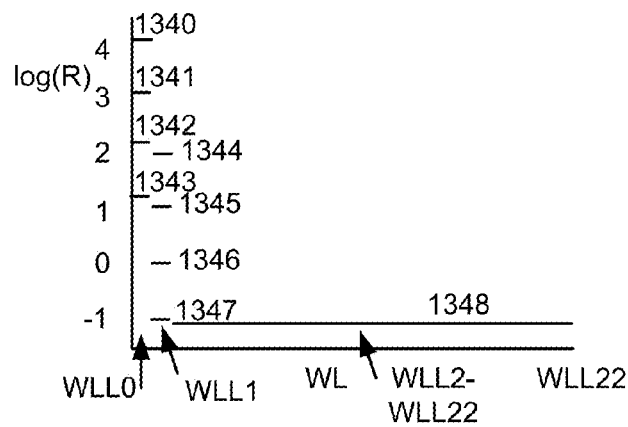
FIG. 13E depicts a plot of resistance of a memory cell on a logarithmic scale verses word line position in an erase operation, for a case where WLL0 and WLL1 are programmed and WLL0 uses a lower erase-verify voltage than the remaining word lines.

FIG. 13E depicts a plot of resistance of a memory cell on a logarithmic scale verses word line position in an erase operation, for a case where WLL0 and WLL1 are programmed and WLL0 uses a lower erase-verify voltage than the remaining word lines, which are not programmed Plots 1340, 1341, 1342 and 1343 show the relatively high resistance of a memory cell on WLL0 at the start of an erase operation, and after one, two or three erase-verify loops, respectively. Plots 1344, 1345, 1346 and 1347 show the high resistance (but lower than for the memory cell of WLL0) of a memory cell on WLL1 at the start of an erase operation, and after one, two or three erase-verify loops, respectively. A plot 1348 shows the relatively low resistance of the memory cells on WLL2-WL22 at the start of an erase operation, and after one, two or three erase-verify loops, respectively.

Figure 13F:
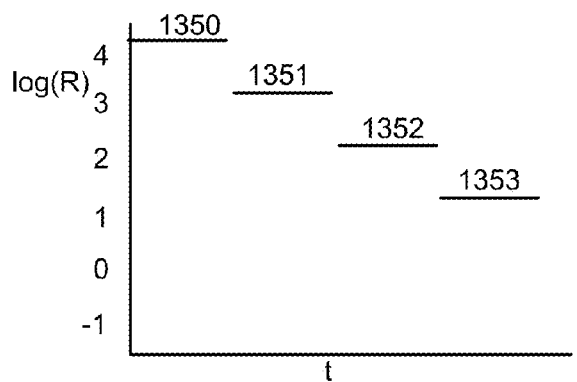
FIG. 13F depicts a plot of resistance of a NAND string on a logarithmic scale verses time, consistent with FIG. 13E.

FIG. 13F depicts a plot of resistance of a NAND string on a logarithmic scale verses time, consistent with FIG. 13E. Plots 1350, 1351, 1352 and 1353 show the resistance of an example NAND string which comprises one memory cell from each word line. The resistance decreases logarithmically after each erase-verify loop, similar to FIG. 13D. The addition of one programmed word line (in addition to WLL0) does not significantly change the resistance of the NAND string.

Figure 13G:
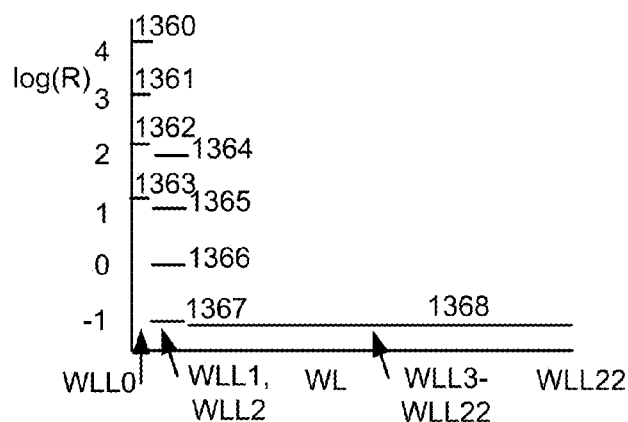
FIG. 13G depicts a plot of resistance of a memory cell on a logarithmic scale verses word line position in an erase operation, for a case where WLL0, WLL1 and WLL2 are programmed and WLL0 uses a lower erase-verify voltage than the remaining word lines.

FIG. 13G depicts a plot of resistance of a memory cell on a logarithmic scale verses word line position in an erase operation, for a case where WLL0, WLL1 and WLL2 are programmed and WLL0 uses a lower erase-verify voltage than the remaining word lines. Plots 1360, 1361, 1362 and 1363 show the relatively high resistance of a memory cell on WLL0 at the start of an erase operation, and after one, two or three erase-verify loops, respectively. Plots 1364, 1365, 1366 and 1367 show the high resistance (but lower than for the memory cell of WLL0) of memory cells on WLL1 and WLL2 at the start of an erase operation, and after one, two or three erase-verify loops, respectively. A plot 1368 shows the relatively low resistance of the memory cells on WLL3-WL22 at the start of an erase operation, and after one, two or three erase-verify loops, respectively.

Figure 13H:
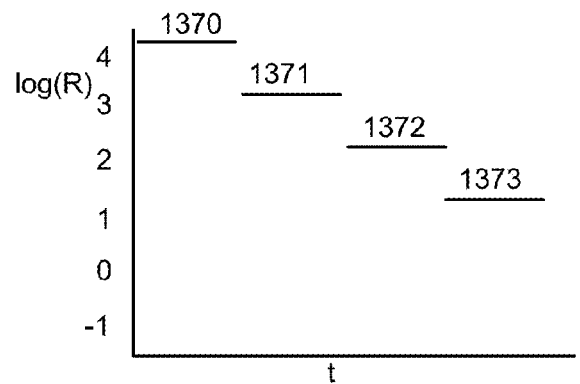
FIG. 13H depicts a plot of resistance of a NAND string on a logarithmic scale verses time, consistent with FIG. 13G.

FIG. 13H depicts a plot of resistance of a NAND string on a logarithmic scale verses time, consistent with FIG. 13G. Plots 1370, 1371, 1372 and 1373 show the resistance of an example NAND string which comprises one memory cell from each word line. The resistance decreases logarithmically after each erase-verify loop, similar to FIG. 13D. The addition of two programmed word lines (in addition to WLL0) does not significantly change the resistance of the NAND string.

Figure 13I:
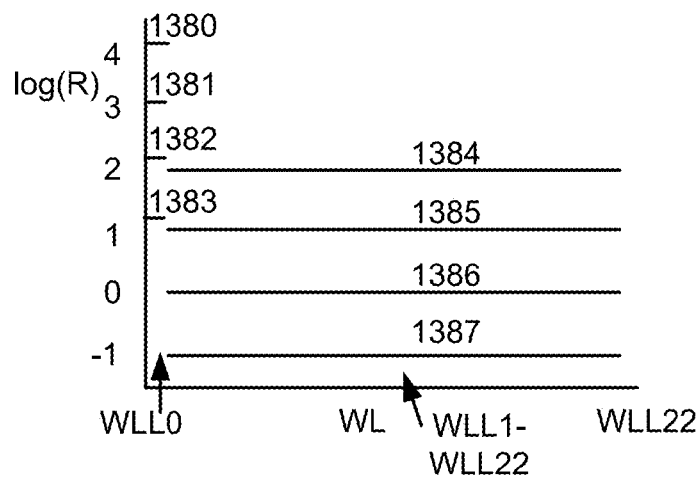
FIG. 13I depicts a plot of resistance of a memory cell on a logarithmic scale verses word line position in an erase operation, for a case where all word lines are programmed and WLL0 uses a lower erase-verify voltage than the remaining word lines.

FIG. 13I depicts a plot of resistance of a memory cell on a logarithmic scale verses word line position in an erase operation, for a case where all word lines are programmed and WLL0 uses a lower erase-verify voltage than the remaining word lines. Plots 1380, 1381, 1382 and 1383 show the relatively high resistance of a memory cell on WLL0 at the start of an erase operation, and after one, two or three erase-verify loops, respectively. Plots 1384, 1385, 1386 and 1387 show the high resistance (but lower than for the memory cell of WLL0) of memory cells on WLL1-WLL22 at the start of an erase operation, and after one, two or three erase-verify loops, respectively. At any time in the erase operation, the resistance of the memory cell on WLL0 still dominates the resistance of the NAND string although to a lesser degree than in FIGS. 13C, 13E and 13G.

Figure 13J:
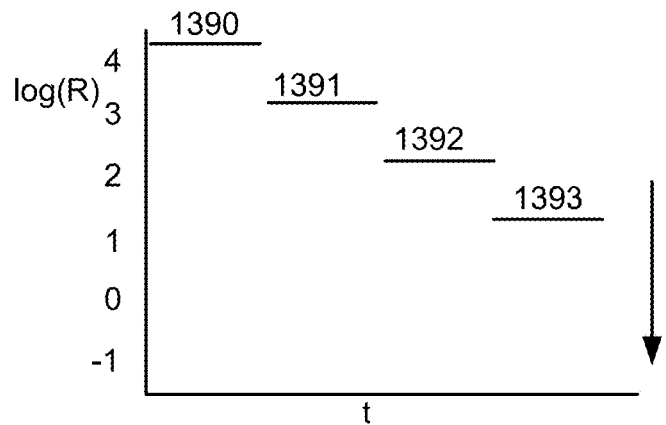
FIG. 13J depicts a plot of resistance of a NAND string on a logarithmic scale verses time, consistent with FIG. 13I.

FIG. 13J depicts a plot of resistance of a NAND string on a logarithmic scale verses time, consistent with FIG. 13I. Plots 1390, 1391, 1392 and 1393 show the resistance of an example NAND string which comprises one memory cell from each word line. The resistance decreases logarithmically after each erase-verify loop, similar to FIG. 13D. The addition of the remaining programmed word lines WLL1-WLL22 (in addition to WLL0) does not significantly change the resistance of the NAND string. This shows how the resistance of the memory cell of WLL0 dominates the resistance of a NAND can therefore control the number of program loops and erase depth for all memory cells in the NAND string.

Figure 14A:
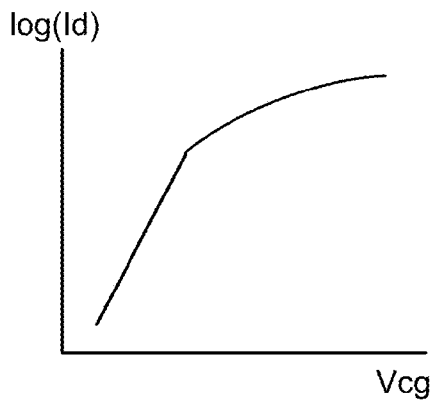
FIG. 14A depicts a plot of current on a logarithmic scale verses control gate voltage for a memory cell.

FIG. 14A depicts a plot of current on a logarithmic scale verses control gate voltage for a memory cell. The drain current tends to increase logarithmically with the control gate voltage until a saturation condition is reached. Operation is typically in the log-linear region. Moreover, since voltage=current×resistance, a logarithmic increase in current corresponds to a logarithmic decrease in resistance, at a given voltage, as depicted in FIG. 13A-13J. This plot explains how the resistance of the memory cell of WLL0 is a controlling factor in a NAND string.

Figure 14B:
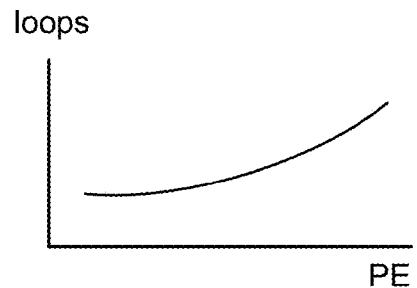
FIG. 14B depicts a plot of a change in a number of erase loop versus PE cycles.

FIG. 14B depicts a plot of a change in a number of erase loop versus PE cycles. As a memory device accumulates PE cycles, it becomes harder to erase and additional erase loops are needed to complete an erase operation. In some cases, it can be desirable to adjust the lower erase-verify voltage used on the first-programmed word line, or the difference between the lower erase-verify voltage and the erase-verify voltage used on the remaining word lines. This adjustment can be made as a function of PE cycles, for instance. For example, the adjustment process of FIG. 8B can be performed periodically at certain PE milestones, or when the number of erase loops exceeds a target value. In another approach, testing is performed to determine if the optimal value for the lower erase-verify voltage which is used on the first-programmed word line should be changed as a function of PE. The memory device is then configured to count the PE cycles and change the erase-verify voltage in a specified way at specified PE milestones.

In other cases, the original lower erase-verify voltage can be used throughout the lifetime of the memory device.

Accordingly, it can be seen that, in one embodiment, a method for operating a memory device (100) comprises: in response to a programming command involving a set of memory cells arranged in a plurality of NAND strings and connected to a plurality of word lines, programming memory cells of the set of memory cells which are connected to one or more word lines among the plurality of word lines, wherein the programming occurs according to a word line programming order of the plurality of word lines in which programming occurs first for memory cells connected to a particular word line of the plurality of word lines, and each memory cell of the set of memory cells comprises a gate and a channel; and in response to an erase command, after the programming, performing a plurality of erase-verify loops of an erase operation for the set of memory cells, wherein each erase-verify loop of the plurality of erase-verify loops comprises an erase portion in which a positive channel-to-gate voltage is provided for each memory cell in the set of memory cells followed by a verify test in which a first verify voltage is applied to the particular word line and, concurrently, a second verify voltage, higher than the first verify voltage is applied to remaining word lines of the plurality of word lines while sensing currents in the plurality of NAND strings, wherein the erase operation is completed when the verify tests indicates a completion criterion is met.

In another embodiment, a memory device comprises: a set of memory cells arranged in a plurality of NAND strings, wherein each memory cell of the set of memory cells comprises a gate and a channel; a plurality of word lines connected to the set of memory cells, the plurality of word lines comprise a particular word line and remaining word lines; and a control circuit. The control circuit, to perform an erase operation, is configured to: perform a plurality of erase-verify loops for the set of memory cells, each erase-verify loop of the plurality of erase-verify loops comprises an erase portion in which a positive channel-to-gate voltage is provided for each memory cell in the set of memory cells followed by a verify test in which a first verify voltage is applied to the particular word line and, concurrently, a second verify voltage, higher than the first verify voltage is applied to remaining word lines of the plurality of word lines.

In another embodiment, a memory controller (122) comprises: a storage device (122a, 122b, 126a) comprising a set of instructions (160) and a processor (122c) operable to execute the set of instructions. The set of instructions comprises: instructions for perform a plurality of erase-verify loops for a set of memory cells arranged in a plurality of NAND strings and connected to a plurality of word lines, each erase-verify loop of the plurality of erase-verify loops comprises an erase portion in which a positive channel-to-gate voltage is provided for each memory cell in the set of memory cells followed by a verify test in which a first verify voltage is applied to the particular word line of the plurality of word lines and, concurrently, a second verify voltage, higher than the first verify voltage is applied to remaining word lines of the plurality of word lines.

In another embodiment, a memory device comprises: a set of memory cells arranged in a plurality of NAND strings, wherein each memory cell of the set of memory cells comprises a gate and a channel; a plurality of word lines connected to the set of memory cells, the plurality of word lines comprise a particular word line and remaining word lines; and a control circuit. The control circuit is configured to: in response to a programming command, program memory cells of the set of memory cells which are connected to one or more word lines among the plurality of word lines, wherein the programming occurs according to a word line programming order of the plurality of word lines in which programming occurs first for memory cells connected to a particular word line of the plurality of word lines; and in response to an erase command, after the programming, perform a plurality of erase-verify loops of an erase operation for the set of memory cells, wherein each erase-verify loop of the plurality of erase-verify loops comprises an erase portion in which a positive channel-to-gate voltage is provided for each memory cell in the set of memory cells followed by a verify test in which a first verify voltage is applied to the particular word line and, concurrently, a second verify voltage, higher than the first verify voltage is applied to remaining word lines of the plurality of word lines while currents are sensed in the plurality of NAND strings, wherein the erase operation is completed when the verify tests indicates a completion criterion is met.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

The invention claimed is:

1. A method for operating a memory device, comprising:
in response to a programming command involving a set of memory cells arranged in a plurality of NAND strings and connected to a plurality of word lines, programming memory cells of the set of memory cells which are connected to one or more word lines among the plurality of word lines, wherein the programming occurs according to a word line programming order of the plurality of word lines in which programming occurs first for memory cells connected to a particular word line of the plurality of word lines, and each memory cell of the set of memory cells comprises a gate and a channel; and in response to an erase command, after the programming, performing a plurality of erase-verify loops of an erase operation for the set of memory cells, wherein each erase-verify loop of the plurality of erase-verify loops comprises an erase portion in which a positive channel-to-gate voltage is provided for each memory cell in the set of memory cells followed by a verify test in which a first verify voltage is applied to the particular word line and, concurrently, a second verify voltage, higher than the first verify voltage is applied to remaining word lines of the plurality of word lines while sensing currents in the plurality of NAND strings, wherein the erase operation is completed when the verify tests indicates a completion criterion is met.

2. The method of claim 1, wherein:
the second verify voltage is applied to the remaining word lines regardless of whether the remaining word lines comprise programmed memory cells.

3. The method of claim 1, wherein:
the sensing comprises concurrently sensing a current in each NAND string of the plurality of NAND strings via a respective bit line and sensing circuitry connected to each NAND string.

4. The method of claim 1, wherein:
the completion criterion is met when at least a specified portion of the NAND strings are in a conductive state.

5. The method of claim 1, further comprising:
adjusting the first verify voltage as a function of a number of program-erase cycles of the set of memory cells.

6. The method of claim 1, further comprising:
adjusting a difference between the first verify voltage and the second verify voltage as a function of a number of program-erase cycles of the set of memory cells.

7. The method of claim 1, wherein:
the plurality of word lines extend between a source-side of the set of memory cells and a drain-side of the set of memory cells in a block;
the particular word line is at the source-side of the set of memory cells; and
the remaining word lines are between the particular word line and the drain-side of the set of memory cells.

8. The method of claim 1, further comprising, prior to the programming command and the erase command, performing an optimization process to determine a value for the first verify voltage, the performing the optimization process comprises:
programming the set of memory cells including memory cells connected to each word line of the plurality of word lines,
erasing the set of memory cells until a verify test indicates the completion criterion is met while the second verify voltage is applied to each word line of the plurality of word lines,
determining a number of erase-verify loops in the erasing of the set of memory cells, and
programming memory cells connected to the one word line, and
determining a value of a verify voltage, which when applied to the one word line in a verify test for the memory cells connected to the one word line, while memory cells of the remaining word lines are in an erased state, results in erasing the memory cells connected to the one word line using a same number of erase-verify loops as the number of erase-verify loops in the erasing of the set of memory cells.

9. A memory device, comprising:
a set of memory cells arranged in a plurality of NAND strings, wherein each memory cell of the set of memory cells comprises a gate and a channel;
a plurality of word lines connected to the set of memory cells, the plurality of word lines comprise a particular word line and remaining word lines; and
a control circuit, the control circuit, to perform an erase operation, is configured to:
perform a plurality of erase-verify loops for the set of memory cells, each erase-verify loop of the plurality of erase-verify loops comprises an erase portion in which a positive channel-to-gate voltage is provided for each memory cell in the set of memory cells followed by a verify test in which a first verify voltage is applied to the particular word line and, concurrently, a second verify voltage, higher than the first verify voltage is applied to remaining word lines of the plurality of word lines.

10. The memory device of claim 9, wherein the control circuit, during the verify test, is configured to:
sense currents in the plurality of NAND strings;
determine if at least a specified portion of the NAND strings are in a conductive state; and
declare that the erase operation is completed if the at least the specified portion of the NAND strings are in the conductive state.

11. The memory device of claim 9, wherein the control circuit, during the verify test, is configured to:
apply the second verify voltage to the remaining word lines regardless of whether the remaining word lines comprise programmed memory cells.

12. The memory device of claim 9, wherein:
the particular word line is a first-programmed word line among the plurality of word lines according to a word line programming order of the plurality of word lines.

13. The memory device of claim 9, wherein:
each NAND string of the plurality of NAND strings extends vertically in the memory device; and
the plurality of word lines comprise word line layers.

14. A method for configuring a memory device, comprising:
programming a set of memory cells including memory cells connected to each word line of a plurality of word lines, wherein the set of memory cells is arranged in a plurality of NAND strings and a particular word line of the plurality of word lines is a first-programmed word line in a word line programming order of the plurality of word lines;
performing a plurality of erase-verify loops for the set of memory cells in a first erase operation, each erase-verify loop in the first erase operation comprises an erase portion and a verify test, wherein the first erase operation is completed when the verify test of the first erase operation is passed, and the verify test of the first erase operation senses current in the NAND strings while a nominal verify voltage is applied to each word line of the plurality of word lines;
determining a count of the plurality of erase-verify loops in the first erase operation; and
programming memory cells connected to the particular word line;
setting a first value of an optimized verify voltage, wherein the optimized verify voltage is lower than the nominal verify voltage;
performing one or more erase-verify loops for the memory cells of the particular word line in a second erase operation, each erase-verify loop in the second erase operation comprises an erase portion and a verify test, wherein the second operation is completed when the verify test of the second operation is passed, the verify test of the second erase operation senses current in the NAND strings while the optimized verify voltage is applied to the particular word line, the nominal verify voltage is applied to each word line of the plurality of word lines, and memory cells of remaining word lines of the plurality of word lines are in an erased state; and
determining a count of the one or more erase-verify loops in the second erase operation; and
if the count of the plurality of erase-verify loops in the first erase operation equals the count of the one or more erase-verify loops in the second erase operation, configuring the memory device to apply the first value of the optimized verify voltage to the particular word line while applying the nominal verify voltage to the remaining word lines during a verify test over a plurality of subsequent erase operations for the set of memory cells.

15. The method of claim 14, wherein:
the set of memory cells is on a chip; and
the configuring the memory device to apply the first value of the optimized verify voltage comprises storing the first value of the optimized verify voltage in a storage location on the chip.

16. The method of claim 14, further comprising if the count of the plurality of erase-verify loops in the first erase operation does not equal the count of the one or more erase-verify loops in the second erase operation:
setting a second value of an optimized verify voltage, wherein the optimized verify voltage is lower than the nominal verify voltage;
performing one or more erase-verify loops for the memory cells of the particular word line in a third erase operation, each erase-verify loop in the third erase operation comprises an erase portion and a verify test, wherein the third operation is completed when the verify test of the third operation is passed, the verify test of the third erase operation senses current in the NAND strings while the second value of the optimized verify voltage is applied to the particular word line, the nominal verify voltage is applied to each word line of the plurality of word lines, and memory cells of remaining word lines of the plurality of word lines are in the erased state; and
determining a count of the one or more erase-verify loops in the third erase operation; and
if the count of the plurality of erase-verify loops in the first erase operation equals the count of the one or more erase-verify loops in the third erase operation, configuring the memory device to apply the second value of the optimized verify voltage to the particular word line while applying the nominal verify voltage to the remaining word lines during a verify test over the plurality of subsequent erase operations for the set of memory cells.

17. The method of claim 16, wherein:
the second value of the optimized verify voltage is lower than the first value of the optimized verify voltage if the count of the one or more erase-verify loops in the second erase operation is less than the count of the plurality of erase-verify loops in the first erase operation.

18. The method of claim 16, wherein:
the second value of the optimized verify voltage is higher than the first value of the optimized verify voltage if the count of the one or more erase-verify loops in the second erase operation is more than the count of the plurality of erase-verify loops in the first erase operation.

19. A memory controller, comprising:
a storage device comprising a set of instructions, the set of instructions comprising:
instructions for perform a plurality of erase-verify loops for a set of memory cells arranged in a plurality of NAND strings and connected to a plurality of word lines, each erase-verify loop of the plurality of erase-verify loops comprises an erase portion in which a positive channel-to-gate voltage is provided for each memory cell in the set of memory cells followed by a verify test in which a first verify voltage is applied to a particular word line of the plurality of word lines and, concurrently, a second verify voltage, higher than the first verify voltage is applied to remaining word lines of the plurality of word lines; and
a processor operable to execute the set of instructions.

20. The memory controller of claim 19, wherein:
the second verify voltage is applied to the remaining word lines regardless of whether the remaining word lines comprise programmed memory cells.

21. An apparatus, comprising:
means for programming memory cells of a set of memory cells arranged in a plurality of NAND strings and connected to a plurality of word lines, the means for programming is responsive to a programming command and programs memory cells of the set of memory cells which are connected to one or more word lines among the plurality of word lines, wherein the programming occurs according to a word line programming order of the plurality of word lines in which programming occurs first for memory cells connected to a particular word line of the plurality of word lines, and each memory cell of the set of memory cells comprises a gate and a channel; and means for performing a plurality of erase-verify loops of an erase operation for the set of memory cells after the programming, wherein the means for performing the plurality of erase-verify loops is responsive to an erase command, each erase-verify loop of the plurality of erase-verify loops comprises an erase portion in which a positive channel-to-gate voltage is provided for each memory cell in the set of memory cells followed by a verify test in which a first verify voltage is applied to the particular word line and, concurrently, a second verify voltage, higher than the first verify voltage is applied to remaining word lines of the plurality of word lines while sensing currents in the plurality of NAND strings, wherein the erase operation is completed when the verify tests indicates a completion criterion is met.

* * * * *